US012802736B2

(12) United States Patent
Cho et al.

(10) Patent No.: US 12,802,736 B2
(45) Date of Patent: Nov. 17, 2026

(54) MEMORY DEVICE INCLUDING ROW HAMMER MANAGING CIRCUIT, AND METHOD OF REFRESH OPERATION FOR THE MEMORY DEVICE

(71) Applicant: Samsung Electronics Co., Ltd., Suwon-si (KR)

(72) Inventors: Sunghye Cho, Suwon-si (KR); Kijun Lee, Suwon-si (KR); Eun Ae Lee, Suwon-si (KR); Jung Min You, Suwon-si (KR); Kyomin Sohn, Suwon-si (KR); Yeonggeol Song, Suwon-si (KR); Myungkyu Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 59 days.

(21) Appl. No.: 18/748,293

(22) Filed: Jun. 20, 2024

(65) Prior Publication Data

US 2025/0218490 A1 Jul. 3, 2025

(30) Foreign Application Priority Data

Dec. 27, 2023 (KR) ........................ 10-2023-0193334

(51) Int. Cl.
*G11C 11/40* (2006.01)
*G11C 11/406* (2006.01)
*G11C 11/408* (2006.01)

(52) U.S. Cl.
CPC .................. *G11C 11/40622* (2013.01); *G11C 11/40615* (2013.01); *G11C 11/408* (2013.01)

(58) Field of Classification Search
CPC ........ G11C 11/40622; G11C 11/40615; G11C 11/408
See application file for complete search history.

(56) References Cited

U.S. PATENT DOCUMENTS 10,950,288 B2 3/2021 Nale et al.
10,969,997 B2 4/2021 Nale
(Continued)

FOREIGN PATENT DOCUMENTS

CN 116343857 A 6/2023
KR 10-2020-0115115 A 10/2020
KR 10-2023-0069567 A 5/2023

*Primary Examiner* — Vanthu T Nguyen
(74) *Attorney, Agent, or Firm* — Muir Patent Law, PLLC

(57) ABSTRACT

A memory device includes a plurality of memory cells and a refresh control circuit that generates a refresh row address and performs a refresh operation on memory cells of a row corresponding to the refresh row address. The refresh control circuit includes a row hammer managing circuit that includes a first row address generator that receives first input row addresses during a first monitoring length and determines a first candidate address among the first input row addresses based on a first reference address, a second row address generator that receives second input row addresses during a second monitoring length longer than the first monitoring length and determines a second candidate address among the second input row addresses based on a second reference address, and a row address checker that determines an aggressor row address based on the first candidate address and the second candidate address.

20 Claims, 23 Drawing Sheets

(56) References Cited

U.S. PATENT DOCUMENTS

| | | | |
|---|---|---|---|
| 11,282,561 B2 | 3/2022 | Nale et al. | |
| 11,688,452 B2 | 6/2023 | Nale et al. | |
| 11,942,138 B2 * | 3/2024 | Kim | G11C 11/40611 |
| 12,354,640 B2 * | 7/2025 | Kim | G11C 7/02 |
| 2019/0228813 A1 | 7/2019 | Nale et al. | |
| 2021/0151095 A1 | 5/2021 | Nale et al. | |
| 2022/0189532 A1 | 6/2022 | Nale et al. | |
| 2023/0154521 A1 | 5/2023 | Kim | |
| 2023/0195337 A1 | 6/2023 | Gatto et al. | |
| 2023/0206988 A1 | 6/2023 | Ayyapureddi | |
| 2023/0386548 A1 | 11/2023 | Nale et al. | |

* cited by examiner

200

600

MEMORY DEVICE INCLUDING ROW HAMMER MANAGING CIRCUIT, AND METHOD OF REFRESH OPERATION FOR THE MEMORY DEVICE

CROSS-REFERENCE TO RELATED APPLICATION(S)

This application claims priority to and the benefit of Korean Patent Application No. 10-2023-0193334 filed in the Korean Intellectual Property Office on Dec. 27, 2023, the disclosure of which is incorporated herein by reference in its entirety.

BACKGROUND

(a) Field

The present disclosure relates to a row hammer managing circuit, a memory device including the row hammer managing circuit, and a method of refresh operation for the memory device.

(b) Description of the Related Art

Volatile memory devices, such as dynamic random access memory (DRAM), store data by storing charges in a capacitor of a memory cell, and read data by determining the charges stored in the capacitor. Since the charges stored in the capacitor may leak over time, the memory device periodically performs a refresh operation.

A memory controller accesses addresses of the memory device randomly, and often accesses specific addresses intensively. As a density of the memory cell in the memory device increases, a voltage distribution of a certain row may affect charges of memory cells in adjacent rows. In particular, when a certain row is attacked by intensive access, the data stored in the memory cells of the adjacent rows may change due to a voltage in an activation state of the row. This phenomenon is called a row hammer. Therefore, it is desired that all rows of the memory device be monitored for the row hammer care.

SUMMARY

According to an embodiment, a memory device may include a memory cell array and a refresh control circuit. The memory cell array may include a plurality of memory cells. The refresh control circuit may generate a refresh row address and perform a refresh operation on memory cells of a row corresponding to the refresh row address. The refresh control circuit may include a row hammer managing circuit (RHMC). The RHMC may include a first row address generator, a second row address generator, and a row address checker. The first row address generator may receive first input row addresses during a first monitoring length and determine a first candidate address among the first input row addresses based on a first reference address. The second row address generator may receive second input row addresses during a second monitoring length longer than the first monitoring length, and determine a second candidate address among the second input row addresses based on a second reference address. The row address checker may determine an aggressor row address based on the first candidate address and the second candidate address. The row corresponding to the refresh row address may be adjacent to a row corresponding to the aggressor row address. Each of the first monitoring length and the second monitoring length may be a cycle for performing the refresh operation.

According to an embodiment, a row hammer managing device includes a first row address generator that receives first input row addresses during a first monitoring length and determines a first candidate address among the first input row addresses based on a first reference address; a second row address generator that receives second input row addresses during a second monitoring length longer than the first monitoring length, and determines a second candidate address among the second input row addresses based on a second reference address; and a row address checker that determines an aggressor row address based on the first candidate address and the second candidate address.

According to an embodiment, a memory device may include a memory cell array and a refresh control circuit. The memory cell array may include a plurality of memory cells. The refresh control circuit may generate candidate addresses based on a reference address and row addresses input during different monitoring lengths, generate an aggressor row address based on whether the candidate addresses match, and output refresh row addresses of rows adjacent to a row corresponding to the aggressor row address. The memory device may perform a refresh operation on memory cells of rows corresponding to the refresh row addresses. Each of the different monitoring lengths may be a cycle for performing the refresh operation.

According to an embodiment, a method of a refresh operation for a memory device is provided. The method may include receiving row addresses during different monitoring lengths, generating candidate addresses based on a reference address and the received row addresses, comparing the candidate addresses, modifying the reference address based on the comparison result, determining an aggressor row address based on the comparison result, and performing a refresh on memory cells of a row adjacent to a row corresponding to the aggressor row address. Each of the different monitoring lengths may be a cycle for performing the refresh on the memory cells of the row adjacent to the row corresponding to the aggressor row address.

DETAILED DESCRIPTION OF THE EMBODIMENTS

Figure 1:
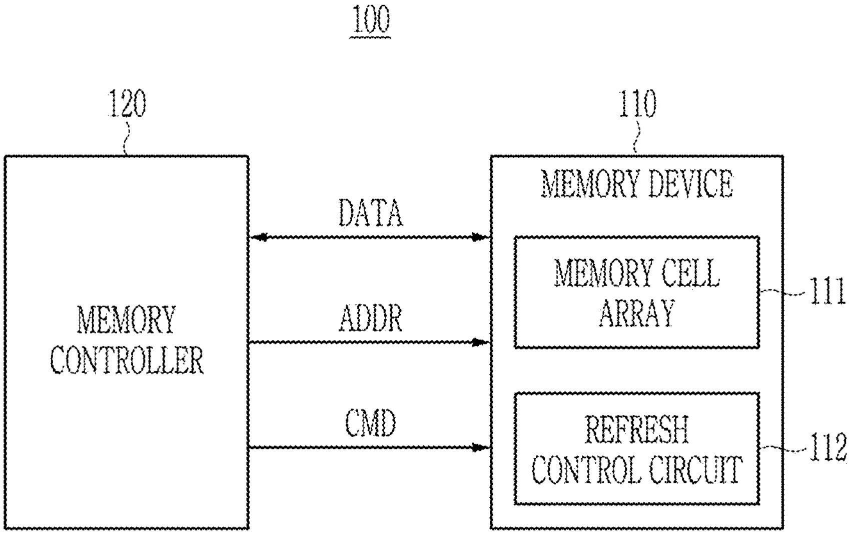
FIG. 1 is a block diagram of a memory system according to an embodiment.

In the following detailed description, only certain exemplary embodiments of the present disclosure have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. In the flowchart described with reference to the drawing, the order of operations may change, several operations may be merged, certain operations may be divided, and specific operations may not be performed.

In addition, expressions written as singular may be interpreted as singular or plural, unless explicit expressions such as "one" or "single" are used. Terms including ordinal numbers, such as first and second, may be used to describe various components, but the components are not limited by these terms. These terms may be used to distinguish one component from another.

FIG. 1 is a block diagram of a memory system according to an embodiment.

Referring to FIG. 1, a memory system 100 according to an embodiment may include a memory device 110 and a memory controller 120. In some embodiments, the memory device 110 and the memory controller 120 are connected through a memory interface and may exchange signals through the memory interface.

The memory device 110 may include a memory cell array 111 and a refresh control circuit 112. The memory cell array 111 may include a plurality of memory cells defined by a plurality of rows and a plurality of columns. In some embodiments, rows may be defined by word lines and columns may be defined by bit lines. The refresh control circuit 112 detects an aggressor row (or attack row) among a plurality of rows, determines a row address ("victim row address") of a victim row to be refreshed based on the row address (referred to as "aggressor row address") of the aggressor row, and output the victim row address. In some embodiments, the aggressor row may be a row hammer aggressor row, and the victim row may be a row that is a target of row hammer care. In some embodiments, the refresh control circuit 112 may select the aggressor row address and output the victim row address at a refresh time.

The memory controller 120 provides signals to the memory device 110 to control a memory operation of the memory device 110. The signal may include a command CMD and an address ADDR. In some embodiments, the memory controller 120 may further provide a clock signal to the memory device 110 and provide the command CMD and the address ADDR to the memory device 110 in synchronization with the clock signal, thereby controlling an operation of the memory device 110.

In some embodiments, the memory controller 120 may provide the command CMD and the address ADDR to the memory device 110 to access the memory cell array 111 and control memory operations such as read or write. Data may be transmitted from the memory cell array 111 to the memory controller 120 according to the read operation, and data may be transmitted from the memory controller 120 to the memory cell array 111 according to the write operation.

The command CMD may include an active command, a read/write command, and a refresh command. In some embodiments, the command CMD may further include a precharge command. The active command may be a command that switches a target row of the memory cell array 111 to an activated state in order to write data to the memory cell array 111 or read data from the memory cell array 111. The memory cell of the target row may be activated (e.g., driven) in response to the active command. The read/write command may be a command to perform a read or write operation on a target memory cell of the row that has been switched to the activated state. The refresh command may be a command for performing a refresh operation in the memory cell array 111.

The memory device 110 may generate aggressor row refresh command signals in response to the refresh command. The aggressor row refresh may refer to an operation of detecting aggressor patterns with a uniform row distribution type and sequentially refreshing victim rows (adjacent rows) of the aggressor rows determined from the aggressor pattern.

The refresh control circuit 112 may determine aggressor rows in response to the aggressor row refresh command signal and output an aggressor row address. In embodiments, lengths (or sizes) of the aggressor patterns for aggressing the memory cells of the memory device 110 may be different. The refresh control circuit 112 may include a plurality of row address generators and a row address checker to protect against various aggressor patterns having various lengths. The plurality of row address generator determines the aggressor rows, and the row address checker may verify the aggressor rows determined by the plurality of row address generators. The lengths of the aggressor patterns monitored by the plurality of row address generators may be different. The configuration of the plurality of row address generators and the row address checker will be described later with reference to FIGS. 4 to 19.

In some embodiments, the memory device 110 may generate the normal refresh command signal or a target row refresh (TRR) command signal in response to the refresh command. The memory device 110 may include a command decoder (or control logic) that generates the command signals in response to the refresh command. The TRR command signal may be a refresh command that determines the victim row based on the count number of the active command and instructs an operation to refresh the victim row. The normal refresh command signal may be a refresh command that instructs a normal refresh operation, for example, an operation to sequentially refresh the rows of the memory cell array 111.

In some embodiments, the aggressor row refresh command signal may be included in the TRR command signal. For example, the memory device 110 may generate some of the TRR command signals as the aggressor row refresh command signals based on a predetermined ratio. The memory cell array 111 may be refreshed in response to the refresh command.

In some embodiments, the memory controller 120 may access the memory device 110 upon a request from a host external to the memory system 100. The memory controller 120 may communicate with the host using various protocols.

The memory device 110 may be a storage device based on a semiconductor device. In some embodiments, the memory device 110 may include a dynamic random access memory (DRAM) device. Examples of the memory device 110 may include double data rate synchronous dynamic random access memory (DDR SDRAM), low power double data rate (LPDDR) SDRAM, graphics double data rate (GDDR) SDRAM, and rambus dynamic random access memory (RDRAM), etc.

In some embodiments, the memory device 110 may include other volatile or non-volatile memory devices in which the refresh operation is used.

Figure 2:
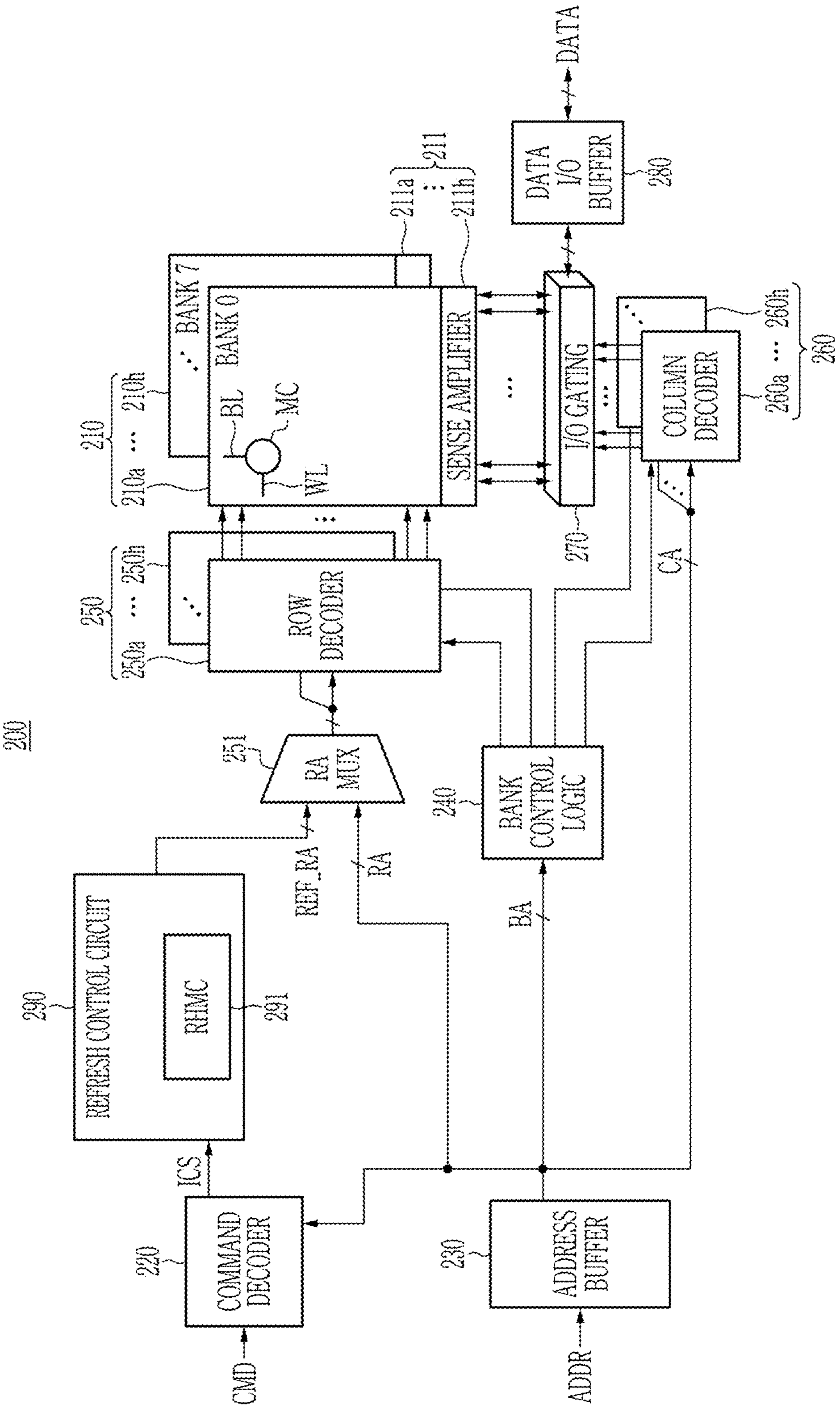
FIG. 2 is a block diagram of a memory device according to an embodiment.
Figure 3:
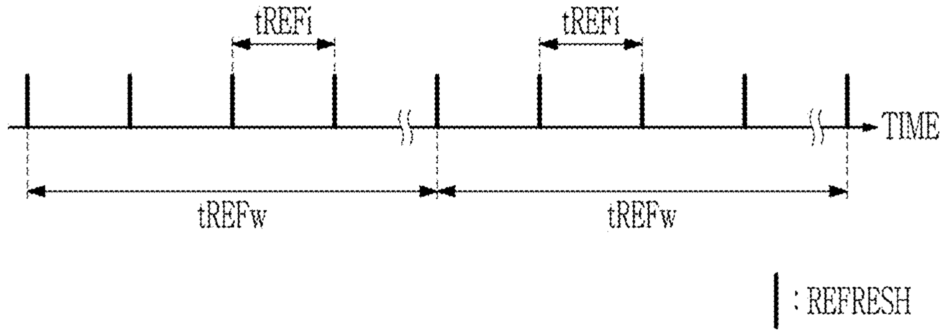
FIG. 3 is a diagram illustrating a timing of a refresh operation of the memory device according to an embodiment.

FIG. 2 is a block diagram of a memory device 200 according to an embodiment. FIG. 3 is a diagram illustrating a timing of a refresh operation of the memory device 200 according to an embodiment.

Referring to FIG. 2, the memory device 200 according to an embodiment may include a memory cell array 210, a sense amplifier 211, a command decoder 220, and an address buffer 230, bank control logic 240, a row decoder 250, a row address multiplexer (RA MUX) 251, a column decoder 260, an input/output (I/O) gating circuit 270, a data I/O buffer 280, and a refresh control circuit 290. The memory device 200, the memory cell array 210, and the refresh control circuit 290 may respectively correspond to the memory device 110, the memory cell array 111, and the refresh control circuit 112 of FIG. 1.

The memory cell array 210 may include a plurality of memory cells MC. In some embodiments, the memory cell array 210 may include a plurality of memory banks 210*a* to 210*h*. Although eight memory banks (e.g., BANK0 to BANK7 210*a* to 210*h*) are illustrated in FIG. 2, the number of memory banks is not limited thereto. Each of the memory banks 210*a* to 210*h* may include a plurality of rows, a plurality of columns, and the plurality of memory cells MC arranged at intersections of the plurality of rows and the plurality of columns. In some embodiments, the plurality of rows may be defined by a plurality of word lines WL, and the plurality of columns may be defined by a plurality of bit lines BL.

The command decoder 220 may generate a control signal to enable the memory device 200 to perform a read operation, a write operation, or a refresh operation. The command decoder 220 may generate an internal command signal ICS by decoding the command CMD received from the memory controller (120 in FIG. 1). The internal command signal ICS may include an active signal, a precharge signal, a refresh signal, a write signal, an erase signal, a read signal, etc. The active signal may correspond to the active command of the memory controller 120. In some embodiments, the active command of the memory controller 120 may be provided directly to the refresh control circuit 290. The refresh signal may include the aggressor row refresh command signal, the normal refresh command signal, the TRR command signal, etc. According to an embodiment, the command decoder 220 may output a signal to other components (e.g., the row decoder 250, etc.) of the memory device 200.

Referring to FIGS. 2 and 3, a 32 ms or 64 ms refresh window time tREFw defined in a joint electron device engineering council (JEDEC) standard may be set. The memory controller 120 may transmit the refresh command REFRESH to allow the memory device 200 to complete refresh during the refresh window time tREFw. For example, the memory controller 120 may transmit the refresh command REFRESH based on a basic refresh rate time tREFi. The basic refresh rate time tREFi, may be defined as the number of refresh commands REFRESHs of about 8K within, for example, the 32 ms refresh window time tREFw. However, it is not limited to this.

In some embodiments, the memory device 200 may generate the aggressor row refresh command signal, the normal refresh command signal, the TRR command signal, etc., upon receiving the refresh command REFRESH. The memory device 200 may care for the victim rows by the aggressor rows within the refresh window time tREFw based on the aggressor row refresh command signal.

Referring back to FIG. 2, the address buffer 230 may receive an address ADDR provided from the memory controller 120. The address ADDR may include a row address RA indicating a row of the memory cell array 210 and a column address CA indicating a column. The row address RA is provided by the row decoder 250, and the column address CA is provided by the column decoder 260. The row address RA may be provided to the refresh control circuit 290 through the command decoder 220 or directly to the refresh control circuit 290. In some embodiments, the row address RA may be provided to the row decoder 250 through the row address multiplexer 251. In some embodiments, the address ADDR may further include a bank address BA indicating a memory bank.

In some embodiments, the row address multiplexer 251 may receive a row address RA from the address buffer 230 and a row address REF_RA to be refreshed from the refresh control circuit 290. The row address multiplexer 251 may selectively output the row address RA received from the address buffer 230 and the row address REF_RA received from the refresh control circuit 290 to the row decoder 250. In some embodiments, the row address multiplexer 251 may receive an internal command signal ICS (e.g., refresh signal) of the command decoder 220. The row address multiplexer 251 may output the row address REF_RA to be refreshed in response to the internal command signal ICS.

In FIG. 2, the command decoder 220 and the address buffer 230 are shown as separate components, but is not necessarily limited thereto, and the command decoder 220 and the address buffer 230 may be implemented as one inseparable component.

The row decoder 250 may select a row to be activated among the plurality of rows of the memory cell array 210 based on the row address RA or REF_RA. To this end, the row decoder 250 may apply a driving voltage to the row to be activated. In some embodiments, a plurality of row decoders 250*a* to 250*h* respectively corresponding to the plurality of memory banks 210*a* to 210*h* may be provided.

The column decoder 260 may select a column to be activated among a plurality of columns of the memory cell array 210 based on the column address CA. To this end, the column decoder 260 may activate the sense amplifier 211 corresponding to the column address CA through the I/O gating circuit 270. In some embodiments, a plurality of column decoders 260*a* to 260*h* respectively corresponding to the plurality of memory banks 210*a* to 210*h* may be provided. In some embodiments, the I/O gating circuit 270 gates input/output data and may include a data latch for storing data read from the memory cell array 210 and a write driver for writing data to the memory cell array 210. The data read from the memory cell array 210 may be detected by the sense amplifier 211 and stored in the I/O gating circuit 270 (e.g., data latch). In some embodiments, a plurality of sense amplifiers 211*a* to 211*h* respectively corresponding to a plurality of memory banks 210*a* to 210*h* may be provided.

In some embodiments, the bank control logic 240 may generate a bank control signal in response to the bank address BA. In response to the bank control signal, the row decoder 250 corresponding to the bank address (e.g., among the plurality of row decoders 250*a* to 250*h*) may be activated, and the column decoder 260 corresponding to the bank address (e.g., among the plurality of column decoders 260*a* to 260*h*) may be activated. The activated row decoder may apply a driving voltage to a row to be activated.

In some embodiments, the data (e.g., data stored in a data latch) read from the memory cell array 210 may be provided to the memory controller 120 through the data I/O buffer 280. The data to be written to the memory cell array 210 may be provided to the data I/O buffer 280 from the memory controller 120, and the data provided to the data I/O buffer 280 may be provided to the I/O gating circuit 270.

Referring to FIG. 1 together, the memory controller 120 may periodically transmit the refresh-related command CMD to the memory device 110. The refresh control circuit 290 may schedule the refresh based on the command CMD. Scheduling the refresh by the refresh control circuit 290 may be understood as determining a ratio between the normal refresh and TRR and periodically generating the normal refresh command signal and the TRR command signal based on the determined ratio. In addition, the refresh control circuit 290 may generate some of the TRR command signals as the aggressor row refresh command signals based on a predetermined ratio.

The refresh control circuit 290 may transmit the row address REF_RA to be refreshed to the row decoder 250 in response to the refresh signal among the internal command signals ICS. The refresh control circuit 290 may include a row hammer managing circuit (RHMC) 291. The row hammer managing circuit 291 may monitor an aggressor pattern and determine aggressor rows from the aggressor pattern. The row hammer managing circuit 291 may sequentially output addresses of the aggressor rows in response to the aggressor row refresh command signal. For example, the row hammer managing circuit 291 may output a first aggressor row address in response to a first aggressor row refresh command signal and output a second aggressor row address in response to a second aggressor row refresh command signal. An address value of the second aggressor row address may be greater than an address value of the first aggressor row address, but the embodiment is not necessarily limited thereto.

The row hammer managing circuit 291 may include the plurality of row address generators and the row address checker to protect against the aggressor patterns having various lengths. The monitoring lengths (or intervals) of the plurality of row address generators may be different. For example, the plurality of row address generators may include a first row address generator and a second row address generator. The first row address generator may generate a row address based on a first monitoring length, and the second row address generator may generate a row address based on a second monitoring length, which is longer than the first monitoring length. The row address checker may determine one of the row addresses received from the plurality of row address generators as the aggressor row address. The configuration of the plurality of row address generators and the row address checker will be described later with reference to FIGS. 4 to 19.

In some embodiments, the row hammer managing circuit 291 may be included in the memory controller 120.

The refresh control circuit 290 may determine the victim row address based on the aggressor row address. The refresh control circuit 290 may output the victim row address as the row address REF_RA to be refreshed.

In some embodiments, the refresh control circuit 290 may further include a TRR control circuit and a normal refresh control circuit. The TRR control circuit may determine the aggressor row based on the count number of the active command and determine the victim row address based on the determined aggressor row. The TRR control circuit may output the row address where the TRR will be performed in response to the TRR command signal among the internal the command signals ICS.

The normal refresh control circuit may output the row address where the normal refresh operation will be performed in response to the normal refresh command signal among the internal the command signals ICS. The normal refresh control circuit may sequentially increase or decrease the row address each time the normal refresh operation is performed.

In some embodiments, the refresh control circuit 290 may further include a refresh row address selector. The refresh row address selector may selectively output the row addresses determined by the row hammer managing circuit 291, the TRR control circuit, and the normal refresh control circuit. For example, the refresh row address selector may output one of the row addresses as the refresh row address REF_RA in response to the refresh signal.

Figure 4:
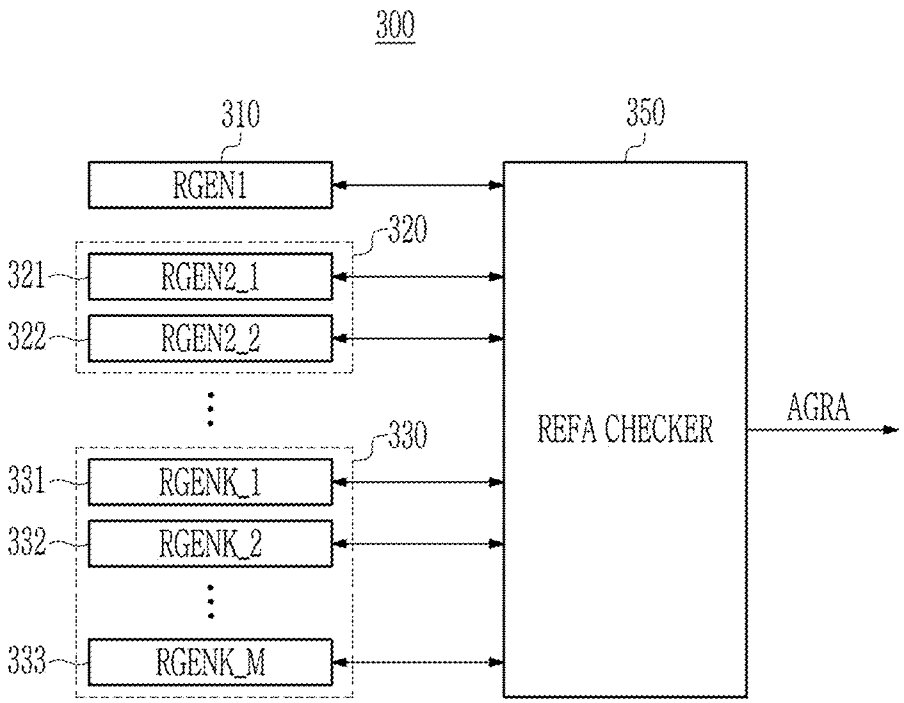
FIG. 4 is a block diagram of a row hammer managing circuit according to an embodiment.

FIG. 4 is a block diagram of a row hammer managing circuit 300 according to an embodiment. The row hammer managing circuit 300 may correspond to the row hammer managing circuit 291 of FIG. 2.

Referring to FIG. 4, the row hammer managing circuit 300 according to an embodiment may generate an aggressor row address AGRA. The row hammer managing circuit 300 may monitor row addresses input along with an active command and detect aggressor patterns from the row addresses. The row hammer managing circuit 300 may sequentially output the aggressor row address AGRA based on the aggressor rows of the aggressor pattern.

The row hammer managing circuit 300 according to the embodiment may include a plurality of row address generators 310, 320, and 330 and a row address checker (REFA checker) 350.

The plurality of row address generators 310, 320, and 330 may receive active commands and row addresses. The plurality of row address generators 310, 320, and 330 may have different monitoring lengths. For example, the plurality of row address generators 310, 320, and 330 may include a first row address generator RGEN1 310 that operates based on a first monitoring length, second row address generators RGEN2_1 and RGEN2_2 320 that operate based on a second monitoring length, and Kth row address generators RGENK_1 to RGENK_M 330 that operate based on a Kth monitoring length (K is an integer greater than 2). In this case, the second monitoring length may be longer than the first monitoring length, and the Kth monitoring length may be longer than the second monitoring length.

In an embodiment, the command decoder 220 or the refresh control circuit 290 in FIG. 2 of the memory device 200 may transmit aggressor row refresh command signals based on the monitoring lengths of the plurality of row address generators 310, 320, and 330. For example, the command decoder 220 or the refresh control circuit 290 may transmit the aggressor row refresh command signal to the first row address generator 310 using the first monitoring length. The command decoder 220 or the refresh control circuit 290 may use the first monitoring length as a cycle for transmitting the aggressor row refresh command signal. Likewise, the command decoder 220 or the refresh control circuit 290 may transmit the aggressor row refresh command signal to each of the second and Kth row address generators 320 and 330 using the second monitoring length and the Kth monitoring length.

Each of the second and Kth row address generators 320 and 330 may also include the plurality of row address generators. The number of row address generators included in the second and Kth row address generators 320 and 330 may be determined based on the monitoring length. For example, the row hammer managing circuit 300 may include $2^{N-1}$ Nth row address generators having an Nth monitoring length that is N times (N is an integer greater than 1) the first monitoring length.

In an embodiment, the second row address generators 320 may include two second row address generators 321 and 322. The second monitoring length of the second row address generators 320 may be twice the first monitoring length. Monitoring start times of the second row address generators 321 and 322 may be different.

In an embodiment, the Kth row address generators 330 may include M Kth row address generators 331 to 333. The Kth monitoring length of the Kth row address generators 330 may be K times the first monitoring length. At this time, M may be equal to $2^{K-1}$. The monitoring start times of the Kth row address generators 331 to 333 may be different.

The plurality of row address generators 310, 320, and 330 may monitor the row addresses based on their own monitoring lengths. The plurality of row address generators 310, 320, and 330 may determine candidate addresses from the row addresses. The plurality of row address generators 310, 320, and 330 may output the candidate addresses to the row address checker 350 when receiving the aggressor row refresh command signal. In example embodiments, the times at which the command decoder 220 or the refresh control circuit 290 transmits the aggressor row refresh command signal to the plurality of row address generators 310, 320, and 330 may be the same or different.

The row address checker 350 may generate the aggressor row address AGRA based on the candidate addresses received from the plurality of row address generators 310, 320, and 330.

The row address checker 350 may verify the plurality of row address generators 310, 320, and 330 based on the candidate addresses. For example, the row address checker 350 may determine that the plurality of row address generators 310, 320, and 330 operate normally if the candidate addresses match. When the candidate addresses do not match, the row address checker 350 may determine that at least one of the plurality of row address generators 310, 320, and 330 operates abnormally.

In an embodiment, the row address checker 350 may compare candidate addresses of row address generators of adjacent levels. The row address generators of adjacent levels may refer to row address generators with adjacent monitoring lengths. For example, the first row address generator 310 and the second row address generators 320 may be the row address generators of adjacent levels.

The row address checker 350 may compare the candidate addresses of the first row address generator 310 with the candidate addresses of the second row address generators 320. For example, the row address checker 350 may compare the candidate addresses of the first row address generator 310 and the second row address generator 321 at the first aggressor row refresh time. For another example, the row address checker 350 may compare the candidate addresses of the first row address generator 310 and the second row address generator 322 at the first aggressor row refresh time and the subsequent second aggressor row refresh time.

The row address checker 350 may compare candidate addresses at different times. For example, at the second aggressor row refresh time, the row address checker 350 may compare the candidate address of the first row address generator 310 at the first aggressor row refresh time and the candidate address of the second row address generator 321 at the second aggressor row refresh time. The configuration in which the row address checker 350 compares the candidate addresses will be described later with reference to FIGS. 4 to 17.

In an embodiment, the row address checker 350 may determine that the first row address generator 310 operates abnormally when the candidate addresses of the first row address generator 310 and the second row address generators 320 do not match. That is, when the candidate addresses of the row address generators of adjacent levels do not match, the row address checker 350 may determine that a row address generator of a previous level among the two levels operates abnormally. For example, among the first level and the second level, the first level may be a level preceding the second level.

The row address checker 350 may correct a reference address of the first row address generator 310 that operates abnormally. The first row address generator 310 may generate a candidate address based on the corrected reference address.

Likewise, the row address checker 350 may compare the candidate addresses of the Kth row address generator 330 and the row address generator of the previous level and determine the row address generator that operates abnormally. In an embodiment, when K is 3, the row address generators of the previous level of the Kth row address generator 330 may be the second row address generators 320.

In addition, the row address checker 350 may determine one of the candidate addresses as the aggressor row address AGRA based on the comparison result. The row address checker 350 may output the aggressor row address AGRA. For example, when the plurality of row address generators 310, 320, and 330 operate normally, the row address checker 350 may determine the candidate address of the row address generator (i.e., the first row address generator 310) of the earliest level as the aggressor row address AGRA.

When at least one of the plurality of row address generators 310, 320, and 330 operates abnormally, the row address checker 350 may determine a candidate address of a row address generator at the subsequent level of the abnormally operating row address generator as the aggressor row address AGRA. For example, the row address checker 350 may determine the candidate address of the second row address generator 320 as the aggressor row address AGRA when the first row address generator 310 is abnormal, and determine the candidate address of the Kth row address generator 330 as the aggressor row address AGRA when the second row address generator 320 is abnormal (when K is 3).

The row address checker 350 may correct the reference address of the generator that operates abnormally. The plurality of row address generators 310, 320, and 330 may generate the candidate addresses by comparing the reference address and the row addresses.

Figure 5:
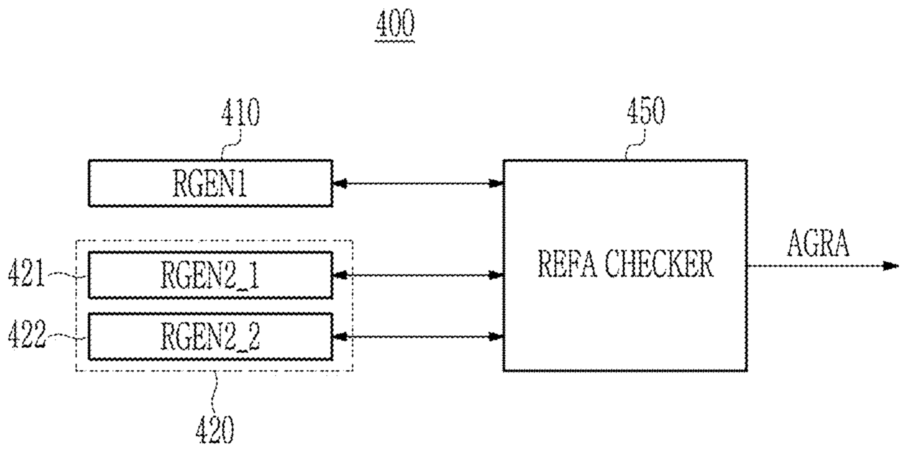
FIG. 5 is a block diagram of the row hammer managing circuit according to an embodiment.
Figure 6:
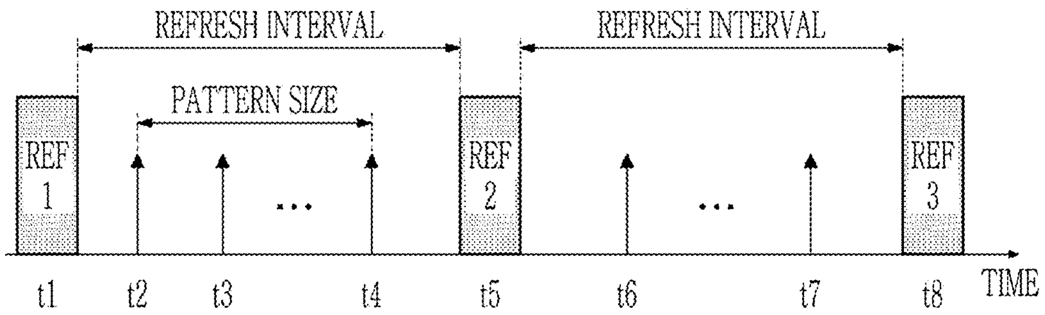
FIG. 6 is a diagram for describing a timing of a refresh interval and aggressor pattern according to an embodiment.
Figure 7:
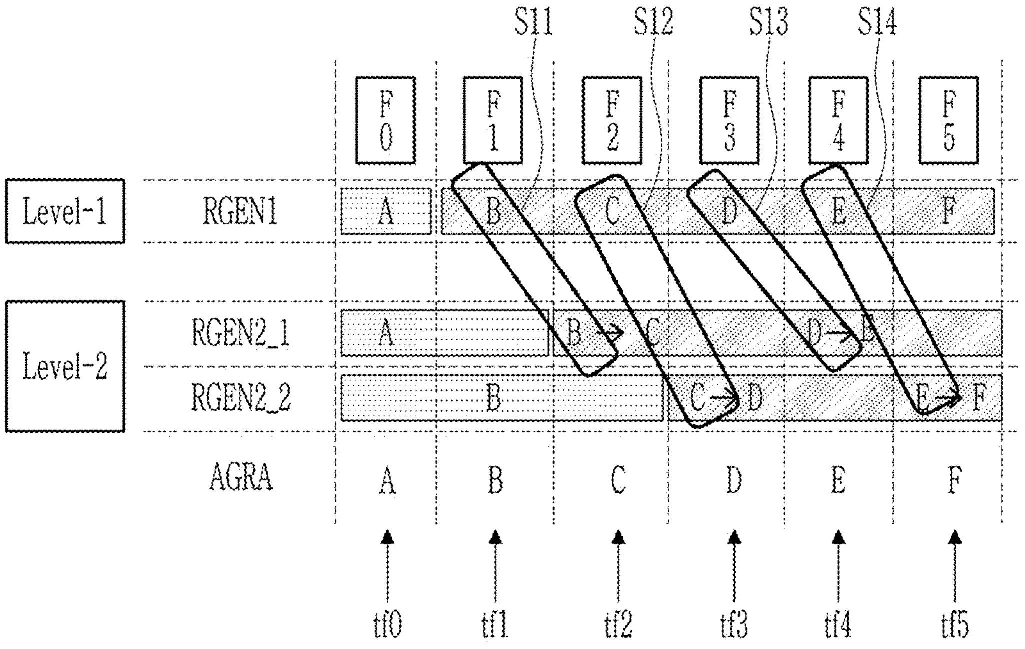
FIG. 7 is a diagram for describing an aggressor row refresh operation of the row hammer managing circuit according to an embodiment.

FIG. 5 is a block diagram of a row hammer managing circuit 400 according to an embodiment. FIG. 6 is a diagram for describing a timing of a refresh interval and aggressor pattern according to an embodiment. FIG. 7 is a diagram for describing an aggressor row refresh operation of the row hammer managing circuit according to an embodiment.

Referring to FIG. 5, the row hammer managing circuit 400 according to an embodiment may include a first row address generator 410, second row address generators 420, and a row address checker 450. The descriptions of the first row address generator 410 and the second row address generators 420 may be equally applied to those of the first row address generator 310 and the second row address generators 320 of FIG. 4. Accordingly, overlapping description will be omitted.

The row address checker 450 may receive candidate addresses from the first row address generator 410 and the second row address generators 420. The row address checker 450 may generate the aggressor row address AGRA based on the candidate addresses. In an embodiment, the row address checker 450 may output one of the candidate addresses as the aggressor row address AGRA.

Referring to FIGS. 5 and 6, the row address checker 450 according to an embodiment may perform an aggressor row refresh operation at a refresh interval. For example, the row address checker 450 may perform the aggressor row refresh operation at times t1, t5, and t8. In some embodiments, a normal refresh operation or a TRR operation may be performed between times t1, t5, and t8. In some embodiments, the refresh interval may be an integer multiple of the basic refresh rate time tREFi of FIG. 3. For example, the refresh illustrated in FIG. 3 may be an aggressor row refresh, normal refresh, or TRR, and the refresh illustrated in FIG. 6 may only illustrate aggressor row refresh among these refreshes.

The row address checker 450 may receive an aggressor pattern from times t2 to t4. The aggressor pattern may have a uniform row distribution type. In other words, the aggressor pattern may be a pattern in which a certain number of rows are repeatedly activated. In an embodiment, the aggressor pattern may be shorter (or shorter or equal to) than the 'refresh interval'. The row address checker 450 may sequentially process the aggressor rows of the aggressor pattern at times t5 and t8. For example, the aggressor pattern may include a first aggressor row and a second aggressor row. The second aggressor row may have a larger row address number than the first aggressor row. The row address checker 450 may refresh adjacent rows of the first aggressor row at time t5. The row address checker 450 may refresh adjacent rows of the second aggressor row at time t8.

Referring to FIGS. 5 to 7, the row hammer managing circuit 400 according to an embodiment may perform aggressor row refresh operations F0 to F5 from time tf0 to tf5.

The first row address generator 410 and the second row address generators 420 may transmit candidate addresses B to F to the row address checker 450 at times tf0 to tf5. In an embodiment, the times tf0, tf1, and tf2 in FIG. 7 may correspond to the times t1, t5, and t8 in FIG. 6.

The first row address generator 410 may transmit the candidate addresses based on the first monitoring length. A first monitoring length may correspond to the 'refresh interval in FIG. 6'. The first row address generator 410 may be initialized at the time tf0 and may start an operation while receiving a reference address A. The first row address generator 410 may receive the reference address A from the row address checker 450. In an embodiment, the reference address A may be the first input row address.

The first row address generator 410 may output a candidate address B at the time tf1 based on the row addresses received from time tf0 to time tf1 and the reference address A. At the time tf1, the second row address generators 420 do not output the candidate addresses, and the row address checker 450 may output the candidate address B as the aggressor row address AGRA. The configuration in which the first row address generator 410 determines the candidate addresses based on the row addresses and the reference address will be described later with reference to FIGS. 18 and 19.

The second row address generators 420 may transmit the candidate addresses based on the second monitoring length. The second monitoring length may correspond to the '(refresh interval in FIG. 6)*2'. The time tf0 at which a second row address generator 421 starts monitoring may be different from the time tf1 at which a second row address generator 422 starts monitoring. For example, the second row address generators 420 may alternately transmit the candidate addresses. For example, the second row address generator 421 may transmit candidate addresses B and D at times tf2 and tf4, and the second row address generator 422 may transmit candidate addresses C and E at times tf3 and tf5.

The row address checker 450 may compare the previous candidate address B of the first row address generator 410 with the candidate address B of the second row address generator 421 at the time tf2 (S11). The candidate address B of the first row address generator 410, which is the comparison target, may be the candidate address B output at the previous time tf1. For example, the row address checker 450 may store the candidate addresses output from the first row address generator 410.

The row address checker 450 may confirm that the candidate addresses B match and determine that the row address generators 410 and 421 are operating normally. The row address checker 450 may output the candidate address C of the first row address generator 410 as the aggressor row address AGRA.

The row address checker 450 may transmit a reference address change signal to the second row address generator 421. The reference address change signal may include the candidate address C of the first row address generator 410 at the time tf2. The second row address generator 421 may change the reference address to C based on the reference address change signal. The second row address generator 421 may output the candidate address D at the time tf4 based on the row addresses received from the time tf2 to the time tf4 and the reference address C.

Likewise, the row address checker 450 may compare the previous candidate address C of the first row address generator 410 with the candidate address C of the second row address generator 421 at the time tf3 (S12). Since the candidate addresses C match, the row address checker 450 may output the candidate address D as the aggressor row address AGRA. The row address checker 450 may change the reference address of the second row address generator 422 to D.

The row address checker 450 may perform the comparison operations (S13 and S14) at the times tf4 and tf5 and output the candidate addresses E and F as the aggressor row address AGRA. In this way, the row hammer managing circuit 400 may protect against the aggressor pattern shorter than the refresh interval.

Figure 8:
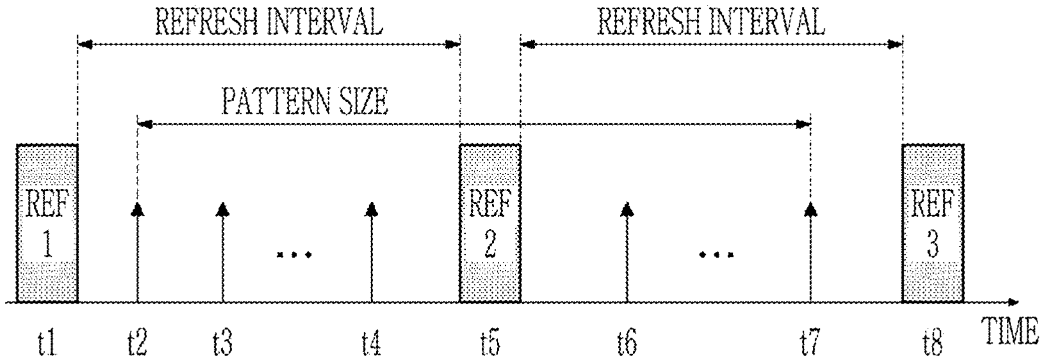
FIG. 8 is a diagram for describing the timing of the refresh interval and aggressor pattern according to an embodiment.
Figure 9:
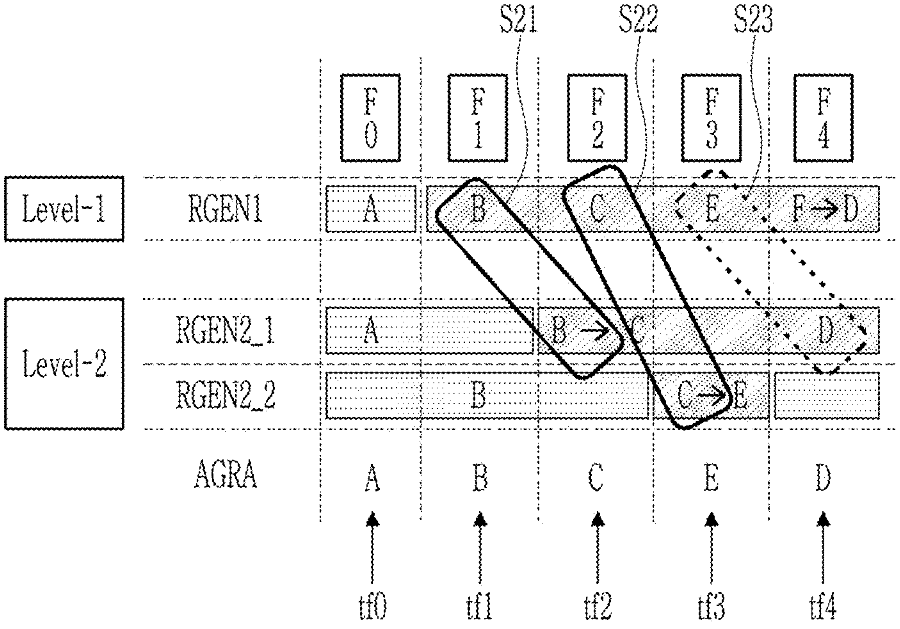
FIG. 9 is a diagram for describing an aggressor row refresh operation of the row hammer managing circuit according to an embodiment.

FIG. 8 is a diagram for describing the timing of the refresh interval and aggressor pattern according to an embodiment. FIG. 9 is a diagram for describing the aggressor row refresh operation of the row hammer managing circuit according to an embodiment.

Referring to FIGS. 5 and 8, the row address checker 450 according to an embodiment may perform the aggressor row refresh operation at the refresh interval. For example, the row address checker 450 may perform the aggressor row refresh operation at the times t1, t5, and t8. In some embodiments, the normal refresh operation or the TRR operation may be performed between the times t1, t5, and t8. In some embodiments, the refresh interval may be an integer multiple of a basic refresh rate time tREFi of FIG. 3.

The row address checker 450 may receive the aggressor pattern at the times t2 to t7. The aggressor pattern may have the uniform row distribution type. In other words, the aggressor pattern may be the pattern in which a certain number of rows are repeatedly activated. In an embodiment, the aggressor pattern may be longer than the 'refresh interval' and shorter (or shorter or equal to) than the 'refresh interval*2'. The row address checker 450 may process the aggressor row of the aggressor pattern at the time t8.

Referring to FIGS. 5, 8, and 9, the row hammer managing circuit 400 according to an embodiment may perform the aggressor row refresh operations F0 to F4 at the time tf0 to tf4.

The first row address generator 410 and the second row address generators 420 may transmit candidate addresses B to F to the row address checker 450 at the times tf0 to tf4. In an embodiment, the times tf2, tf3, and tf4 in FIG. 9 may correspond to the times t1, t5, and t8 in FIG. 8.

The operation of the row hammer managing circuit 400 at the times tf0 to tf2 may be the same in FIGS. 7 and 9. That is, the comparison operation S11 and the comparison operation S21 may be the same, and overlapping descriptions will be omitted.

Since the aggressor pattern is longer than the refresh interval, the first row address generator 410, which determines the candidate address based on the refresh interval, may determine an incorrect candidate address. For example, the first row address generator 410 may output the candidate address E at the time tf3 based on the row addresses received from the time tf2 to the time tf3 and the reference address C. At the time tf3, the candidate address E is not a comparison target, so it may not be determined whether the candidate address E is incorrect.

The row address checker 450 may compare the previous candidate address C of the first row address generator 410 with the candidate address C of the second row address generator 422 at the time tf3 (S22). The candidate address C of the first row address generator 410, which is the comparison target, may be the candidate address C output at the previous time tf2.

The row address checker 450 may confirm that the candidate addresses C match and determine that the row address generators 410 and 422 operate normally. The row address checker 450 may output the candidate address E of the first row address generator 410 as the aggressor row address AGRA.

The row address checker 450 may transmit the reference address change signal to the second row address generator 422. The reference address change signal may include the candidate address E of the first row address generator 410 at the time tf3. The second row address generator 422 may change the reference address to E based on the reference address change signal.

The second row address generator 421 may output the candidate address D at the time tf4 based on the row addresses received from the time tf2 to the time tf4 and the reference address C.

The row address checker 450 may compare the previous candidate address E of the first row address generator 410 with the candidate address D of the second row address generator 421 at the time tf4 (S23). Since the candidate addresses D and E do not match, the row address checker 450 may determine that the first row address generator 410 of the previous level (level 1) operates abnormally. That is, when the candidate addresses do not match, the row address checker 450 may determine that the row address generator of the previous level is abnormal. In an embodiment of FIG. 9, the aggressor pattern is longer than the "refresh interval' and shorter (or shorter or equal to) than the 'refresh interval*2', so the second row address generator 420 may normally output the candidate addresses.

The row address checker 450 may change the reference address of the first row address generator 410 to the candidate address D of the second row address generator 421. That is, the first row address generator 410 outputs the candidate address F at the time tf4, but since the candidate address F is generated based on the incorrect candidate address E at the time tf3, the reference address changes to D.

The row address checker 450 may initialize the second row address generator 422. In this case, the initialization may mean deactivation of the candidate address. For example, the row address checker 450 may deactivate the candidate address to be output by the second row address generator 422 at the time (e.g., tf5) after the time tf4. In other words, the row address checker 450 may not use the candidate address output from the second row address generator 422 at the time tf5 in the comparison operation. The second row address generator 422 may output the candidate address based on the reference address C at the subsequent refresh time of the aggressor row refresh operation F4.

Since the row address checker 450 determines that the first row address generator 410 is abnormal in the comparison operation (S23), it may output the candidate address D of the second row address generator 421 as the aggressor row address AGRA. In this way, the row hammer managing circuit 400 may protect against the aggressor pattern longer than the refresh interval.

Figure 10:
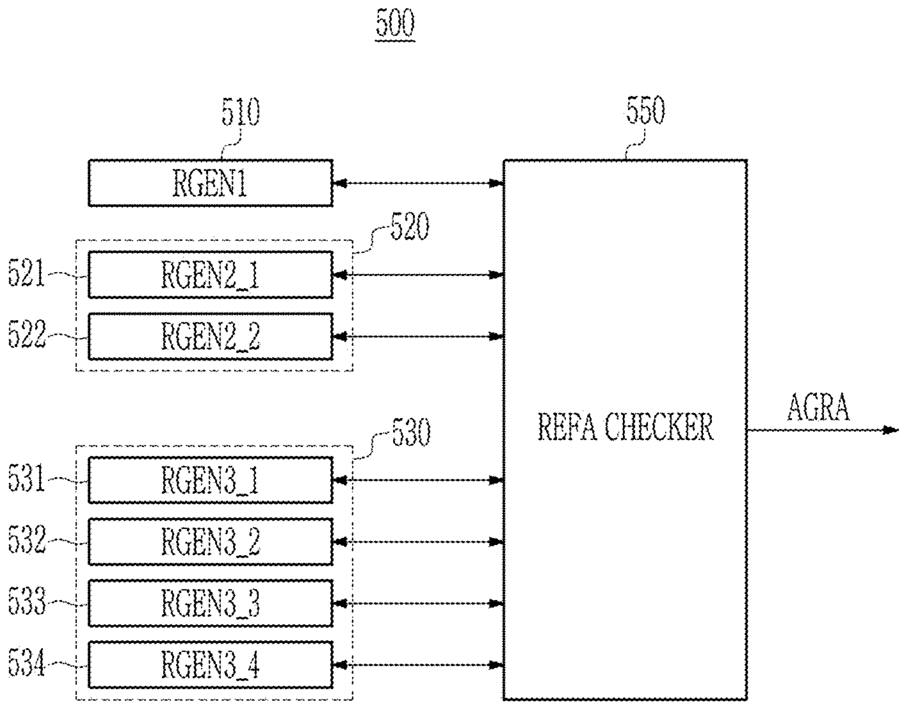
FIG. 10 is a block diagram of the row hammer managing circuit according to an embodiment.
Figure 11:
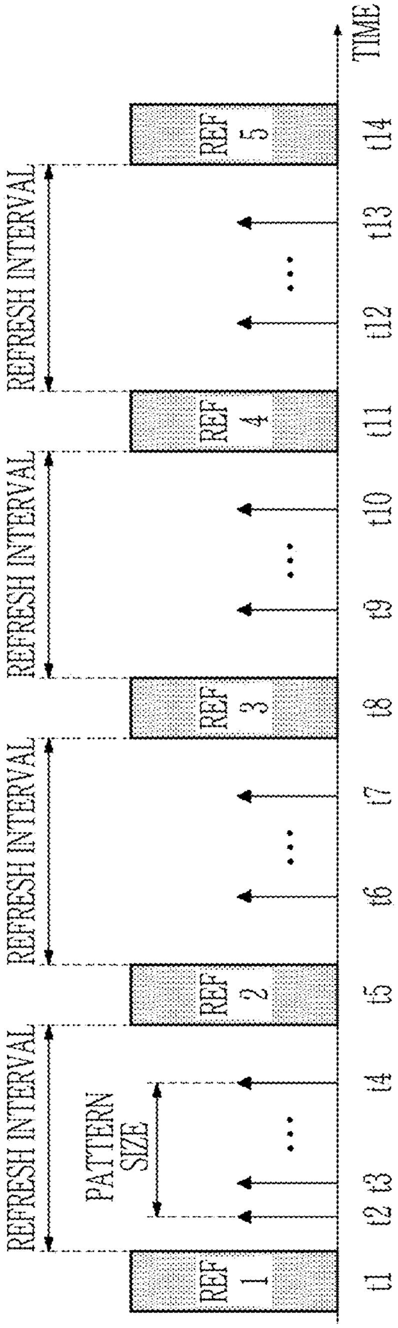
FIG. 11 is a diagram for describing the timing of the refresh interval and an aggressor pattern according to an embodiment.
Figure 12:
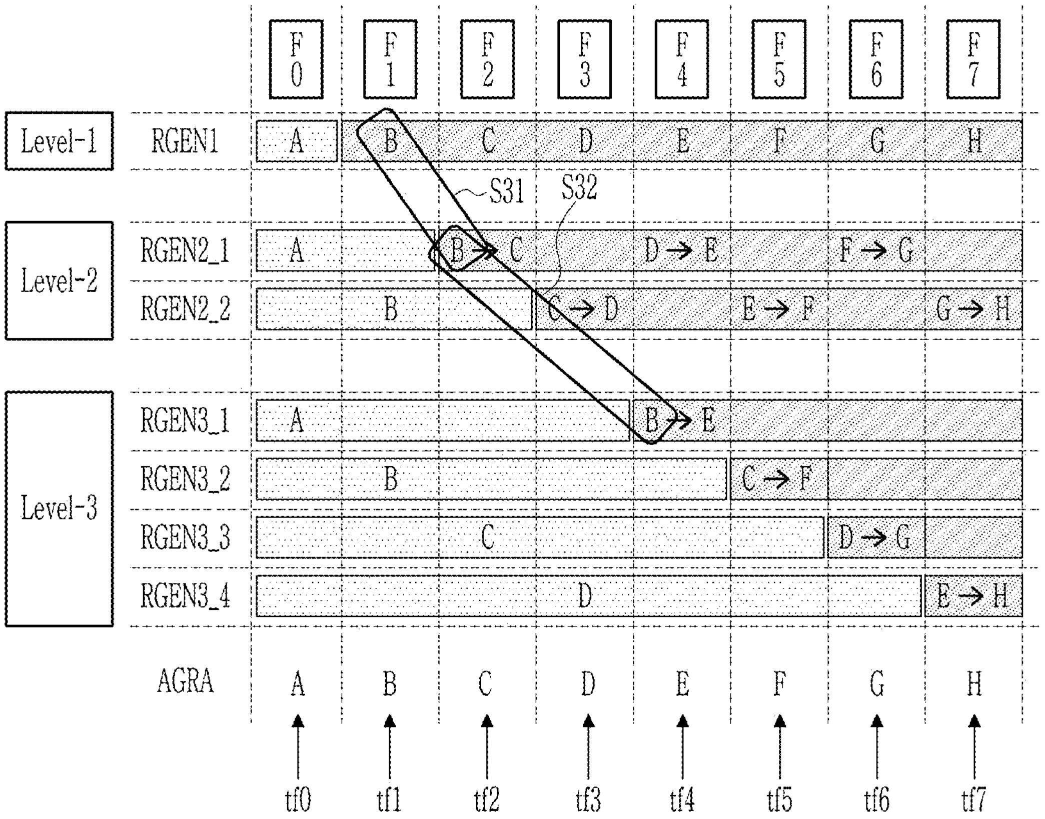
FIG. 12 is a diagram for describing the aggressor row refresh operation of the row hammer managing circuit according to an embodiment.

FIG. 10 is a block diagram of the row hammer managing circuit according to an embodiment. FIG. 11 is a diagram for describing the timing of the refresh interval and aggressor pattern according to an embodiment. FIG. 12 is a diagram for describing the aggressor row refresh operation of the row hammer managing circuit according to an embodiment.

Referring to FIG. 10, a row hammer managing circuit 500 according to an embodiment may include a first row address generator 510, second row address generators 520, third row address generators 530, and a row address checker 550. The descriptions of the first row address generator 510 and the second row address generators 520 may be equally applied to those of the first row address generator 410 and the second row address generators 420 of FIG. 5. Accordingly, overlapping description will be omitted.

The third row address generators 530 may include four third row address generators 531 to 534. A third monitoring length of the third row address generators 530 may be four times a first monitoring length. The third row address generators 531 to 534 may have different monitoring start times. The third row address generators 531 to 534 may start monitoring at a time interval of the first monitoring length. For example, the third row address generator 531 may start monitoring and the third row address generator 532 may start monitoring after the first monitoring length.

The row address checker 550 may receive the candidate addresses from the first to third row address generators 510 to 530. The row address checker 550 may generate the aggressor row address AGRA based on the candidate addresses. In an embodiment, the row address checker 550 may output one of the candidate addresses as the aggressor row address AGRA.

Referring to FIGS. 10 and 11, the row address checker 550 according to an embodiment may perform the aggressor row refresh operation at the refresh interval. For example, the row address checker 550 may perform the aggressor row refresh operation at times t1, t5, t8, t11, and t14. In some embodiments, the normal refresh operation or the TRR operation may be performed between the times t1, t5, t8, t11, and t14. In some embodiments, the refresh interval may be an integer multiple of the basic refresh rate time tREFi of FIG. 3.

The row address checker 550 may receive the aggressor pattern from the times t2 to t4. The aggressor pattern may have the uniform row distribution type. In other words, the aggressor pattern may be the pattern in which a certain number of rows are repeatedly activated. In an embodiment, the aggressor pattern may be shorter (or shorter or equal to) than the 'refresh interval'. The row address checker 550 may sequentially process the aggressor rows of the aggressor pattern at the times t5, t8, t11, and t14. For example, the aggressor pattern may include a first aggressor row, a second aggressor row, a third aggressor row, and a fourth aggressor row. The second aggressor row may have a row address number greater than the first aggressor row, the third aggressor row may have a row address number greater than the second aggressor row, and the fourth aggressor row may have a row address number greater than the third aggressor row. The row address checker 550 may sequentially refresh adjacent rows of the first to fourth aggressor rows at the times t5, t8, t11, and t14.

Referring to FIGS. 10 to 12, the row hammer managing circuit 500 according to an embodiment may perform aggressor row refresh operations F0 to F7 at the times tf0 to tf7.

The first to third row address generators 510 to 530 may transmit the candidate addresses B to H to the row address checker 550 at the times tf0 to tf7. In an embodiment, the times tf0, tf1, tf2, tf3, and tf4 of FIG. 12 may correspond to the times t1, t5, t8, t11, and t14 of FIG. 11.

The first row address generator 510 may transmit the candidate addresses based on the first monitoring length. The first monitoring length may correspond to the 'refresh interval in FIG. 11'. The second row address generators 520 may transmit the candidate addresses based on the second monitoring length. The second monitoring length may correspond to '(refresh interval in FIG. 11)*2'. The third row address generators 530 may transmit the candidate addresses based on the third monitoring length. The third monitoring length may correspond to '(refresh interval in FIG. 11)*4'.

The third row address generators 531-534 may be initialized at different times. For example, the third row address generators 531 to 534 may be initialized at each time tf0, tf1, tf2, and tf3 and may start an operation. For example, the third row address generators 531 to 534 may sequentially output the candidate addresses at each time of the aggressor row refresh operation F0 to F7. For example, the third row address generator 531 may transmit the candidate address B at the time tf4, the third row address generator 532 may transmit the candidate addresses C at the time tf5, the third row address generator 533 may transmit the candidate addresses D at the time tf6, and the third row address generator 534 may transmit the candidate address E at the time tf7.

The contents of FIGS. 5 to 7 may be equally applied to the configuration in which the row address checker 550 compares the candidate addresses of the first and second row address generators 510 and 520. For example, the comparison operation (S31) of the row address checker 550 may correspond to the comparison operation (S11) of FIG. 7. Accordingly, overlapping description will be omitted.

The row address checker 550 may compare the candidate addresses of the second and third row address generators 520 and 530. For example, the row address checker 550 may compare the candidate addresses of the second row address generator 521 and the third row address generators 531 and 533, and compare the candidate addresses of the second row address generator 522 and the third row address generators 532 and 534.

The row address checker 550 may compare the previous candidate address B of the second row address generator 521 with the candidate address B of the third row address generator 531 at the time tf4 (S32). The candidate address B of the second row address generator 521 to be compared may be the candidate address B output by the second row address generator 521 at the previous time (or immediately preceding time, that is, at the time tf2). For example, the row address checker 550 may store the candidate addresses output from the first to third row address generators 510 to 530. In some embodiments, the row address checker 550 may store the candidate addresses output from the first and second row address generators 510 and 520.

The row address checker 550 may confirm that the candidate addresses B match and determine that the row address generators 521 and 531 operate normally. The row address checker 550 may output the candidate address E of the first row address generator 510 as the aggressor row address AGRA.

The row address checker 550 may transmit the reference address change signal to the third row address generator 531. The reference address change signal may include the candidate address E of the first row address generator 510 at the time tf4. The third row address generator 531 may change the reference address to E based on the reference address change signal. The row address checker 550 may confirm that the candidate addresses D of the first and second row address generators 510 and 521 match at the time tf4, and may also transmit the reference address change signal to the second row address generator 521. The second row address generator 521 may change the reference address to E based on the reference address change signal.

Likewise, the row address checker 550 checks that the candidate addresses of the first to third row address generators 510 to 530 match at the time tf5 to tf7, and determine that the first to third row address generators 510 to 530 operates normally. The row address checker 550 may output the candidate addresses E, F, G, and H of the first row address generator 510 as the aggressor row address AGRA, and change the reference addresses of the second and third row address generators 520 and 530 to E, F, G, and H. In this way, the row hammer managing circuit 500 may protect against the aggressor pattern shorter than the refresh interval.

Figure 13:
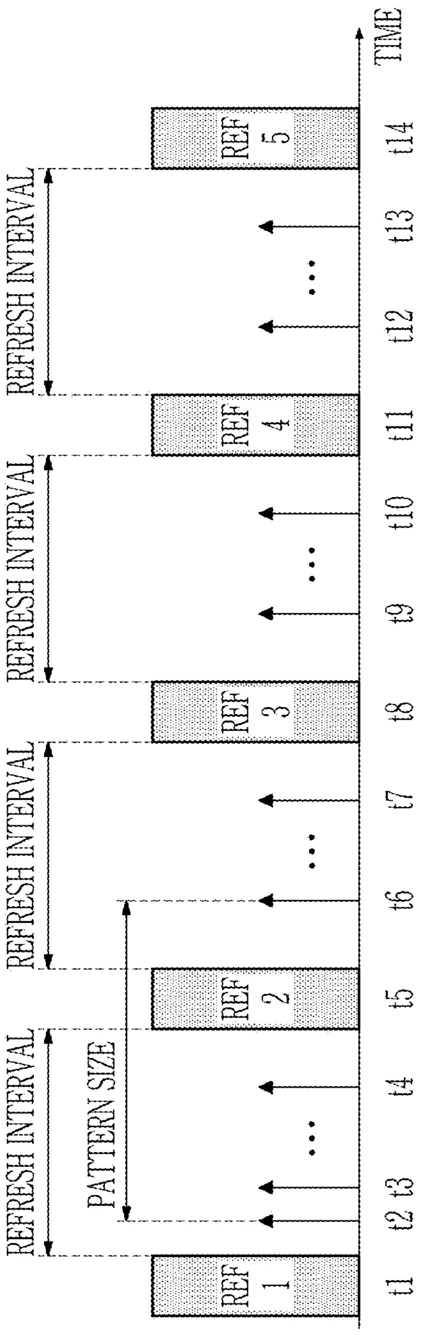
FIG. 13 is a diagram for describing the timing of the refresh interval and aggressor pattern according to an embodiment.
Figure 14:
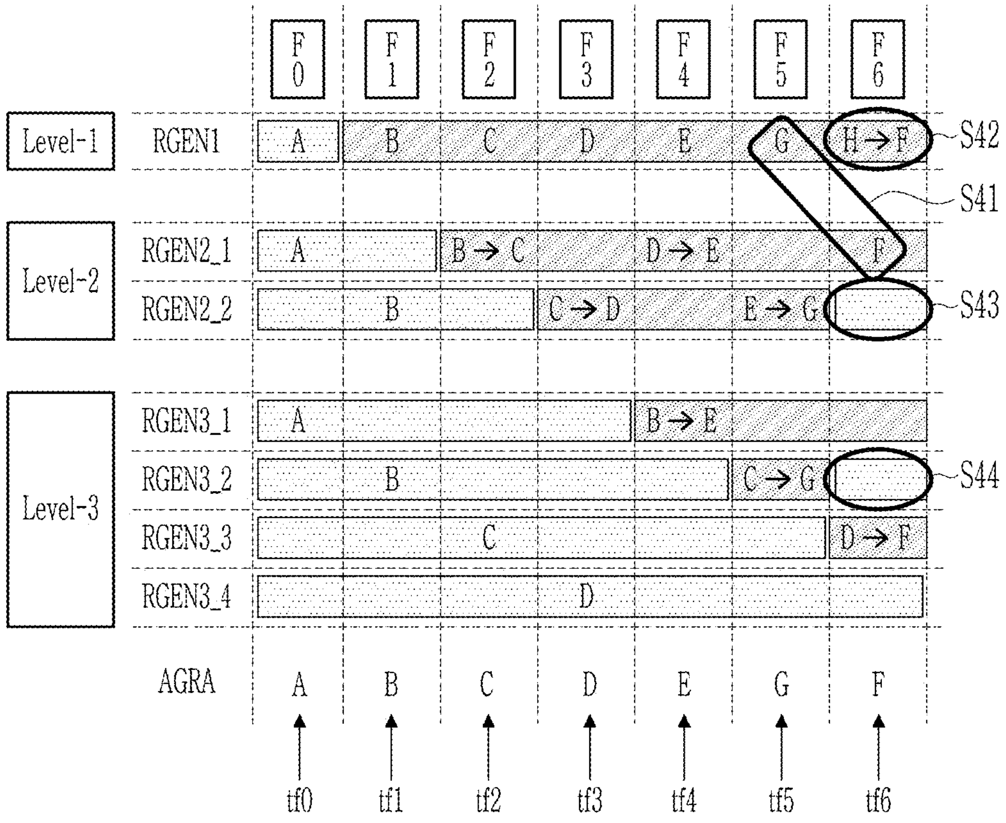
FIG. 14 is a diagram for describing the aggressor row refresh operation of a row hammer managing circuit according to an embodiment.

FIG. 13 is a diagram for describing the timing of the refresh interval and the aggressor pattern according to an embodiment. FIG. 14 is a diagram for describing the aggressor row refresh operation of the row hammer managing circuit according to an embodiment.

Referring to FIGS. 10 and 13, the row address checker 550 according to an embodiment may perform the aggressor row refresh operation at the refresh interval. For example, the row address checker 550 may perform the aggressor row refresh operation at the times t1, t5, t8, t11, and t14. In some embodiments, the normal refresh operation or the TRR operation may be performed between the times t1, t5, t8, t11, and t14. In some embodiments, the refresh interval may be an integer multiple of the basic refresh rate time tREFi of FIG. 3.

The row address checker 550 may receive the aggressor pattern from the times t2 to t6. The aggressor pattern may have the uniform row distribution type. In other words, the aggressor pattern may be a pattern in which a certain number of rows are repeatedly activated. In an embodiment, the aggressor pattern may be longer than the 'refresh interval' and shorter (or shorter or equal to) than the 'refresh interval*2'. The row address checker 550 may process the aggressor row of the aggressor pattern at the times t8, t11, and t14.

Referring to FIGS. 10, 13, and 14, the row hammer managing circuit 500 according to an embodiment may perform the aggressor row refresh operation F0 to F6 at the times tf0 to tf6.

The first to third row address generators 510 to 530 may transmit the candidate addresses B to H to the row address checker 550 at the times tf0 to tf6. In an embodiment, the times tf4, tf5, and tf6 in FIG. 14 may correspond to the times t1, t5, and t8 in FIG. 13.

The operation at the times tf0 to tf4 of the row hammer managing circuit 500 may be the same in FIGS. 12 and 14. Accordingly, overlapping description will be omitted.

Since the aggressor pattern is longer than the refresh interval, the first row address generator 510, which determines the candidate address based on the refresh interval, may determine an incorrect candidate address. For example, the first row address generator 510 may output the candidate address G at the time tf5 based on the row addresses received from the time tf4 to the time tf5 and the reference address E. At the time tf5, the candidate address G is not the comparison target, so it may not be determined whether the candidate address G is incorrect.

The row address checker 550 may compare the previous candidate address E of the first row address generator 510 with the candidate address E of the second row address generator 522 at the time tf5, and compare the previous candidate address C of the second row address generator 522 with the candidate address C of the third row address generator 532. The row address checker 550 may confirm that the candidate addresses E and C match. The row address checker 550 may output the candidate address G of the first row address generator 510 as the aggressor row address AGRA. The row address checker 550 may change the reference addresses of the second and third row address generators 522 and 532 to the candidate address G of the first row address generator 510.

The row address checker 550 may compare the previous candidate address G of the first row address generator 510 with the candidate address F of the second row address generator 521 at the time tf6 (S41). Since the candidate addresses G and F do not match, the row address checker 550 may determine that the first row address generator 510 of the previous level (level 1) operates abnormally. That is, when the candidate addresses do not match, the row address checker 550 may determine that the row address generator of the previous level is abnormal. In the embodiment of FIG. 14, the aggressor pattern is longer than the 'refresh interval' and shorter (or shorter or equal) than the 'refresh interval*2', so the second row address generator 520 may normally output the candidate addresses.

The row address checker 550 may change the reference address of the first row address generator 510 to the candidate address F of the second row address generator 521 (S42). That is, the first row address generator 510 outputs the candidate address H at the time tf6, but the candidate address H is generated based on the incorrect candidate address G at the time tf5, so the reference address changes to F.

The row address checker 550 may initialize the second and third row address generators 522 and 532 whose reference addresses changes based on the candidate address G of the first row address generator 510 (S43 and S44). For example, the address checker 450 may deactivate the candidate address to be output by the second row address generator 522 at the time (e.g., tf7) after the time tf6. The row address checker 450 may deactivate the candidate address to be output by the third row address generator 532 at a time (for example, tf9) after the time tf6.

Since the row address checker 550 determines that the first row address generator 510 is abnormal in the comparison operation (S41), it may output the candidate address F of the second row address generator 521 as the aggressor row address AGRA. In this way, the row hammer managing circuit 500 may protect against the aggressor pattern that is longer than the refresh interval.

Figure 15:
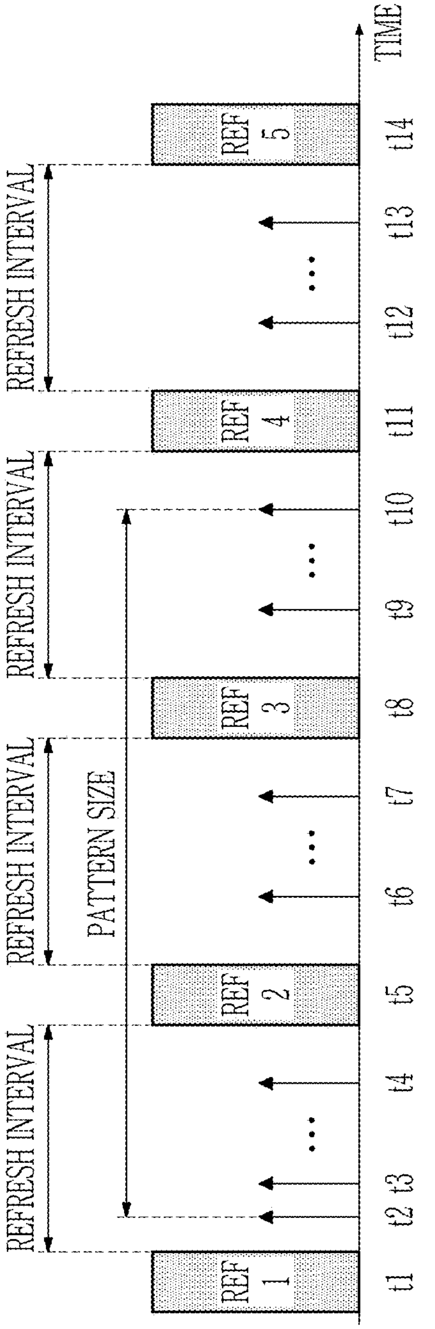
FIG. 15 is a diagram for describing the timing of the refresh interval and aggressor pattern according to an embodiment.
Figure 16:
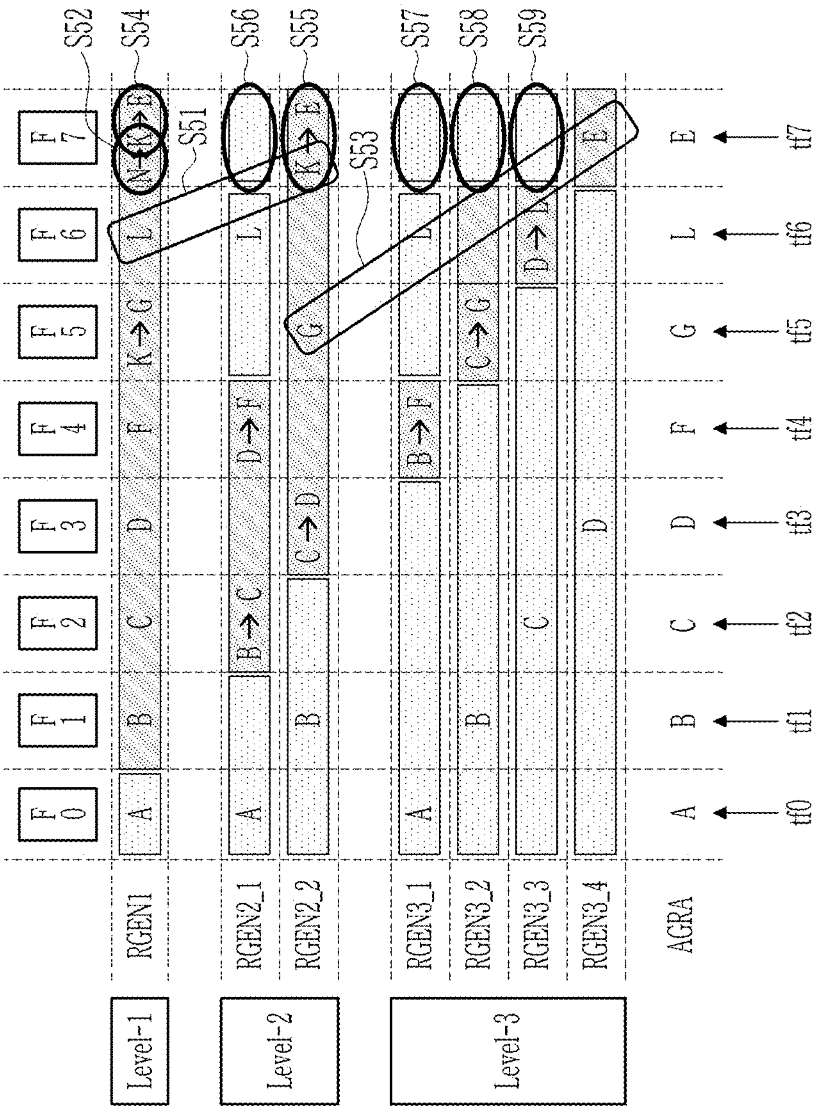
FIG. 16 is a diagram for describing the aggressor row refresh operation of the row hammer managing circuit according to an embodiment.

FIG. 15 is a diagram for describing the timing of the refresh interval and the aggressor pattern according to an embodiment. FIG. 16 is a diagram for describing the aggressor row refresh operation of the row hammer managing circuit according to an embodiment.

Referring to FIGS. 10 and 15, the row address checker 550 according to the embodiment may perform the aggressor row refresh operation at the refresh interval. That is, the row address checker 550 may perform the aggressor row refresh operation at the times t1, t5, t8, t11, and t14. In some embodiments, the normal refresh operation or the TRR operation may be performed between the times t1, t5, t8, t11, and t14. In some embodiments, the refresh interval may be an integer multiple of the basic refresh rate time tREFi of FIG. 3.

The row address checker 550 may receive the aggressor pattern from times t2 to t10. The aggressor pattern may have the uniform row distribution type. In other words, the aggressor pattern may be a pattern in which a certain number of rows are repeatedly activated. In an embodiment, the aggressor pattern may be longer than the 'refresh interval*2' and shorter (or shorter or equal to) than the 'refresh interval*4'. The row address checker 550 may process the aggressor row of the aggressor pattern at the times t8, t11, and t14.

Referring to FIGS. 10, 15, and 16, the row hammer managing circuit 500 according to an embodiment may perform the aggressor row refresh operation F0 to F7 at the times tf0 to tf7.

The first to third row address generators 510 to 530 may transmit the candidate addresses B to G, K, L, and N to the row address checker 550 at the times tf0 to tf7. In an embodiment, the times tf3, tf4, tf5, tf6, and tf7 in FIG. 16 may correspond to the times t1, t5, t8, t11, and t14 in FIG. 15.

The operation at the times tf0 to tf3 of the row hammer managing circuit 500 may be the same in FIGS. 14 and 16. Accordingly, overlapping description will be omitted.

Since the aggressor pattern is longer than the 'refresh interval*2', the first row address generator 510, which determines the candidate address at the refresh interval, or the second row address generator 520, which determines the candidate address at the 'refresh interval*2', may determine the incorrect candidate address. For example, the first row address generator 510 may output the candidate address F at the time tf4 based on the row addresses received from the time tf3 to the time tf4 and the reference address D. At the time tf4, the candidate address F is not the comparison target, so it may not be determined whether the candidate address F is incorrect.

The row address checker 550 may compare the previous candidate address D of the first row address generator 510 with the candidate address D of the first row address generator 521 at the time tf4, and compare the previous candidate address B of the second row address generator 521 with the candidate address B of the third row address generator 531. The row address checker 550 may confirm that the candidate addresses D and B match. The row address checker 550 may output the candidate address F of the first row address generator 510 as the aggressor row address AGRA. The row address checker 550 may change the reference addresses of the second and third row address generators 521 and 531 to the candidate address F of the first row address generator 510.

In addition, the second row address generator 521 may output the candidate address G at the time tf5 based on the row addresses received from the time tf3 to the time tf5 and the reference address D. At the time tf5, the candidate address G is not the comparison target, so it may not be determined whether the candidate address G is incorrect.

The row address checker 550 may compare the previous candidate address F of the first row address generator 510 with the candidate address G of the second row address generator 522 at the time tf5. Since the candidate addresses F and G do not match, the row address checker 550 may determine that the first row address generator 510 of the previous level (level 1) operates abnormally. That is, when the candidate addresses do not match, the row address checker 550 may determine that the row address generator of the previous level is abnormal.

The row address checker 550 may change the reference address of the first row address generator 510 to the candidate address G of the second row address generator 521. That is, the first row address generator 510 outputs the candidate address K at the time tf5, but the candidate address K is generated based on the incorrect candidate address F at the time tf4, so the reference address changes to G.

The row address checker 550 may initialize the second and third row address generators 521 and 531 whose reference addresses changes based on the candidate address F of the first row address generator 510. The row address checker 550 may set the reference address of the second row address generator 521 to the candidate address L of the first row address generator 510 at the time tf6. The second row address generator 521 may output the candidate addresses based on the reference address L.

The row address checker 550 may compare the previous candidate address C of the second row address generator 521 with the candidate address C of the third row address generator 532 at the time tf5. Since the candidate addresses C match, the row address checker 550 may change the reference address of the third row address generator 532 to G. The row address checker 550 may output the candidate address G of the second row address generator 521 as the aggressor row address AGRA.

The row address checker 550 may compare the previous candidate address D of the second row address generator 521 with the candidate address D of the third row address generator 533 at the time tf6. Since the candidate addresses D match, the row address checker 550 may output the candidate address L of the first row address generator 510 as the aggressor row address AGRA. The row address checker 550 may change the reference address of the third row address generator 533 to the candidate address L of the first row address generator 510. At the time tf6, the second row address generator 521 is in an initialized state, so the candidate addresses of the first and second row address generators 510 and 521 may not be compared. The row address checker 550 may determine the candidate address L of the first row address generator 510 as the reference address of the second row address generator 521.

The row address checker 550 may compare the previous candidate address L of the first row address generator 510 with the candidate address K of the second row address generator 521 at the time tf7 (S51). Since the candidate addresses L and K do not match, the row address checker 550 may determine that the first row address generator 510 of the previous level (level 1) operates abnormally.

The row address checker 550 may change the reference address of the first row address generator 510 to the candidate address K of the second row address generator 521 (S52). That is, the first row address generator 510 outputs the candidate address N at the time tf7, but the candidate address N is generated based on the incorrect candidate address L at the time tf6, so the reference address changes to K.

The row address checker 550 may compare the previous candidate address G of the second row address generator 522 with the candidate address E of the third row address generator 534 at the time tf7. Since the candidate addresses G and E do not match, the row address checker 550 may determine that the second row address generator 522 of the previous level (level 2) operates abnormally. In the embodiment of FIG. 16, the aggressor pattern is longer than the 'refresh interval*2' and shorter (or shorter or equal) than the 'refresh interval*4', so the third row address generator 530 may normally output the candidate addresses.

The row address checker 550 may change the reference addresses of the first and second row address generators 510 and 522 to the candidate address E of the third row address generator 534. That is, the candidate addresses N and K of the first and second row address generators 510 and 522 at the time tf7 are incorrect, so the reference address changes to E.

In addition, the row address checker 550 may initialize the second and third row address generators 521, 531, 532, and 533 (S56, S57, S58, and S59). The second and third row address generators 521, 531, 532, and 533 may be initialized because they generate the candidate addresses based on the incorrect reference addresses F, G, and L at the times tf4 to tf6.

Since the row address checker 550 determines that the second row address generator 522 is abnormal in the comparison operation (S51), it may output the candidate address E of the third row address generator 534 as the aggressor row address AGRA. In this way, the row hammer managing circuit 500 may protect against the aggressor pattern that is longer than the 'refresh interval*2'.

Figure 17:
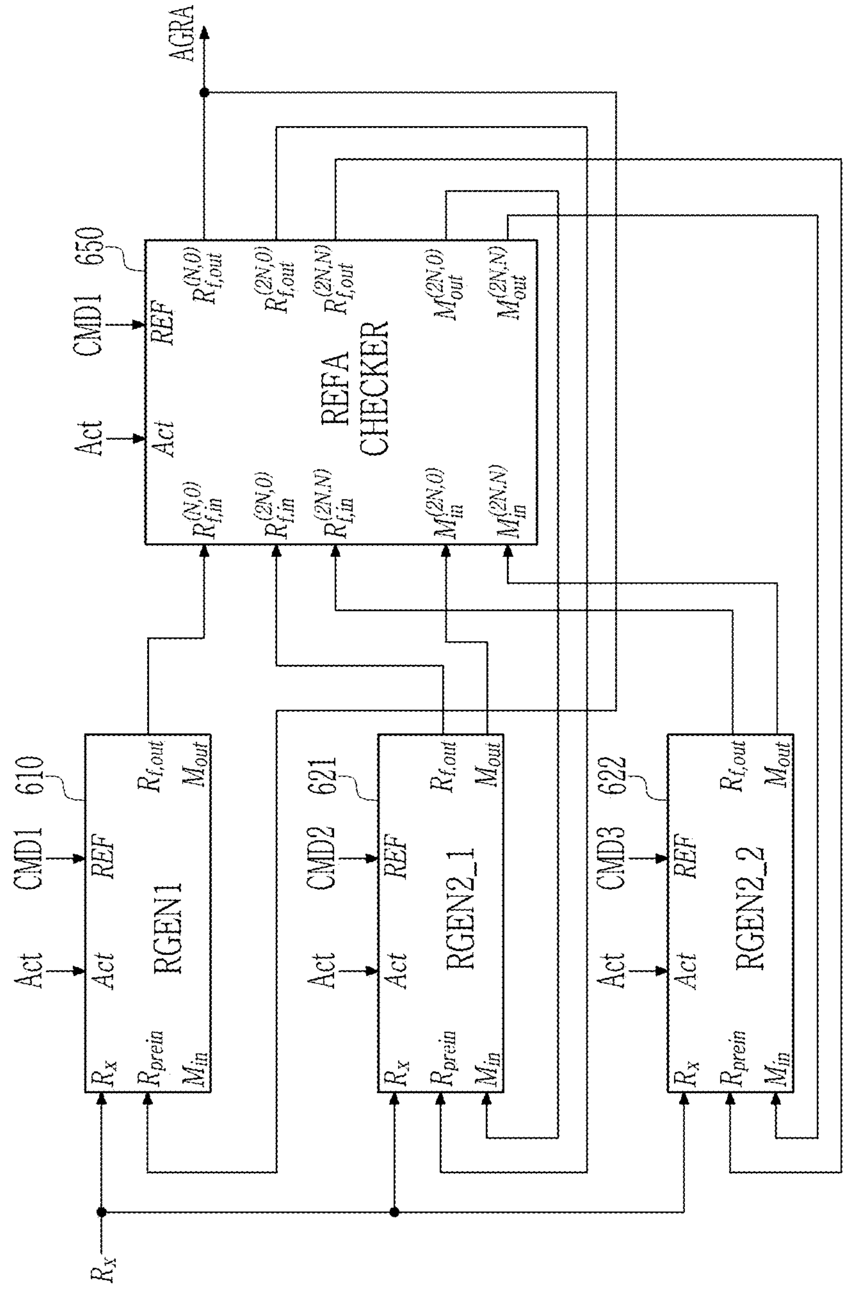
FIG. 17 is a circuit diagram of the row hammer managing circuit according to an embodiment.

FIG. 17 is a circuit diagram of a row hammer managing circuit according to an embodiment.

Referring to FIG. 17, a row hammer managing circuit 600 according to an embodiment may include a first row address generator 610, second row address generators 621 and 622, and a row address checker 650. The row hammer managing circuit 600 may receive an aggressor pattern.

The first row address generator 610 may receive a row address $R_x$, a monitoring signal CMD1, an active signal Act, and a reference address $R_{pre,in}$. The first row address generator 610 may store a candidate address $R_{f,out}$ based on the received signals, and output the candidate address $R_{f,out}$ in response to the monitoring signal CMD1. The monitoring signal CMD1 may be a signal instructing an aggressor row refresh operation. The monitoring signal CMD1 may be a signal corresponding to the aggressor row refresh command signal (e.g., generated by the command decoder 220 or the refresh control circuit 290 in FIG. 2). The monitoring signal CMD1 may have a cycle corresponding to the first monitoring length. For example, the first row address generator 610 may output the candidate address $R_{f,out}$ every time the aggressor row refresh command signal. The configuration in which the first row address generator 610 outputs the candidate address $R_{f,out}$ will be described later with reference to FIGS. 18 and 19.

The second row address generators 621 and 622 may receive the row address $R_x$, the monitoring signals CMD2 and CMD3, the active signal Act, a mode control signal $M_{in}$, and the reference address $R_{pre,in}$. The second row address generators 621 and 622 may store the candidate address $R_{f,out}$ based on the received signals, and output the candidate address $R_{f,out}$ in response to the monitoring signals CMD2 and CMD3. The monitoring signals CMD2 and CMD3 may be signals generated based on the aggressor row refresh command signal and a second monitoring length. The monitoring signals CMD2 and CMD3 may have a cycle corresponding to the second monitoring length. For example, the second row address generators 621 and 622 may alternately output the candidate address $R_{f,out}$ at different aggressor row refresh times.

The second row address generators 621 and 622 may output a mode confirmation signal $M_{out}$ to the row address checker 650 in response to the mode control signal $M_{in}$. When the second row address generators 621 and 622 receive the mode control signal $M_{in}$, they may also output the mode confirmation signal $M_{out}$ when outputting the candidate address $R_{f,out}$.

When the row address checker 650 receives the mode confirmation signal $M_{out}$, it may ignore the candidate address $R_{f,out}$ without using the candidate address $R_{f,out}$. For example, when the row address checker 650 receives the mode confirmation signal $M_{out}$ from the second row address generator 621, it may not use the candidate address $R_{f,out}$ of the second row address generator 621. In this case, the mode confirmation signal $M_{out}$ may be a signal for initialization. The row address checker 650 may receive the mode confirmation signal $M_{out}$ from the second row address generator 621 and transmit a new reference address $R_{pre,in}$ to the second row address generator 621.

In some embodiments, the second row address generators 621 and 622 and the row address checker 650 may operate without the mode control signal $M_{in}$ and the mode confirmation signal $M_{out}$. For example, the row address checker 650 may compare the candidate addresses $R_{f,out}$ and determine the second row address generator (e.g., 621) to initialize. Even if the row address checker 650 receives the candidate address $R_{f,out}$ from the second row address generator 621, it may not be used in the comparison operation. The row address checker 650 may transmit the new reference address $R_{pre,in}$ to the second row address generator 621.

The row address checker 650 may receive the candidate addresses $R_{f,out}$ from the first row address generator 610 and the second row address generators 621 and 622. The row address checker 650 may generate the aggressor row address AGRA based on the candidate addresses $R_{f,out}$. In an embodiment, the row address checker 650 may output one of the candidate addresses $R_{f,out}$ of the row address generators 610, 621, and 622 as the aggressor row address AGRA. When the row address checker 650 receives the monitoring signal CMD1, it may output the aggressor row address AGRA. For example, the row address checker 650 may output the aggressor row address AGRA every time the aggressor row refresh command signal. The configuration in which the row address checker 650 determines the aggressor row address AGRA may be applied in the same way as described with reference to FIGS. 5 to 9. In FIG. 17, the row hammer management circuit 600 is illustrated as including the row address generators 610, 621, and 622 of two levels (first and second levels), but the embodiment is not necessarily limited thereto, and the row hammer management circuit 600 may further include row address generators of a level greater than the second level.

Figure 18:
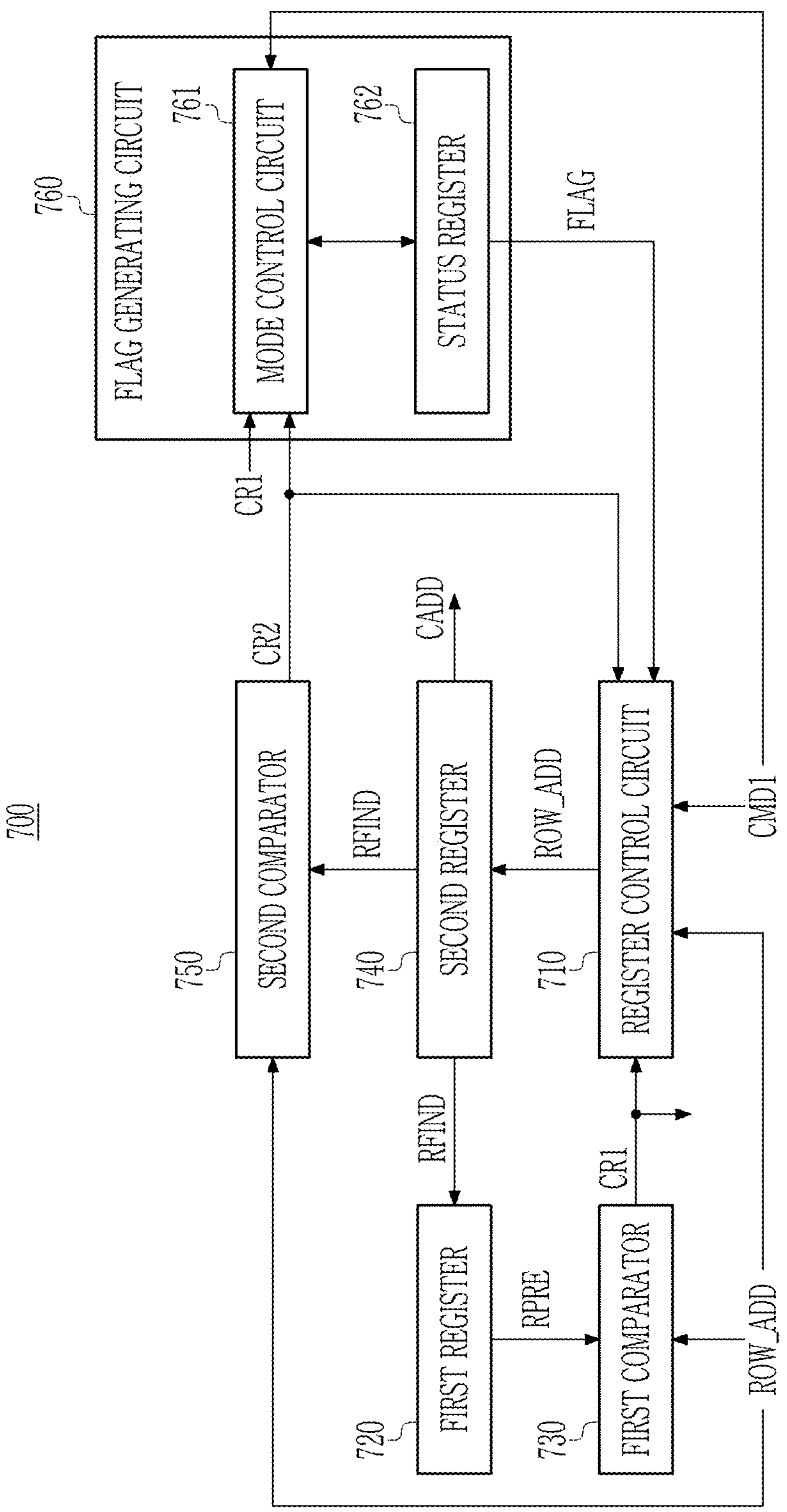
FIG. 18 is a block diagram of a row address generator according to an embodiment.

FIG. 18 is a block diagram of a row address generator according to an embodiment.

Referring to FIG. 18, a first row address generator 700 according to an embodiment includes a register control circuit 710, a first register 720, a first comparator 730, a second register 740, a second comparator 750, and a flag generation circuit 760. The first row address generator 700 has a first monitoring length and may receive an aggressor pattern that is shorter than or equal to the first monitoring length.

The first row address generator 700 may receive an input row address ROW_ADD and the monitoring signal CMD1, and provide a candidate address CADD for protecting against the aggressor pattern based on the input row address ROW_ADD and the monitoring signal CMD1. The input row address ROW_ADD may correspond to the row address $R_x$ in FIG. 17. The candidate address CADD may correspond to the candidate address $R_{f,out}$ in FIG. 17.

The register control circuit 710 may control the second register 740 based on the input row address ROW_ADD, the monitoring signal CMD1, a first comparison result signal CR1, a second comparison result signal CR2, and a flag signal FLAG.

The monitoring signal CMD1 may instruct monitoring in cycles of the first monitoring length. For example, the monitoring signal CMD1 may correspond to the aggressor row refresh command signal. For example, in FIG. 6, the monitoring signal CMD1 may have a first level (e.g., high) at times t1, t5, and t8 and a second level (e.g., low) at other times.

In some embodiments, when the input row address ROW_ADD is first input in a monitoring period, the register control circuit 710 may provide the input row address ROW_ADD to the second register 740. The second register 740 may store the input row address ROW_ADD. The input row address ROW_ADD first input may be referred to as the first input row address. When the first input row address is input, the flag signal FLAG may have a first bit value. For example, the first bit value may be "0" and a second bit value may be "1", but are not limited thereto. Hereinafter, it is assumed that the first bit value of the flag signal FLAG is "0" and the second bit value is "1".

In some embodiments, when the first input row address is smaller than or equal to the reference address Rpre (e.g., $R_{pre,in}$), the flag signal FLAG may have the first bit value. Meanwhile, when the first input row address is greater than the reference address Rpre, the flag signal FLAG may have the second bit value.

In some embodiments, the flag signal FLAG has a first bit value, and the input row address ROW_ADD input after the first input row address in the monitoring period may be greater than the reference address Rpre. In this case, the register control circuit 710 may provide the input row address ROW_ADD to the second register 740 so that the second register 740 stores the input row address ROW_ADD. The bit value of the flag signal FLAG may change from the first bit value to the second bit value. The fact that one row address is greater than another row address may mean, for example, that the address value of the row address is relatively large or that the number of the row address is relatively large.

In some embodiments, the flag signal FLAG may have the first bit value, the input row address ROW_ADD input after the first input row address may be smaller than or equal to the reference address Rpre, and the input row address ROW_ADD may be smaller than or equal to the row address Rfind stored in second register 740. In this case, the register control circuit 710 may provide the input row address ROW_ADD to the second register 740 so that the second register 740 stores the input row address ROW_ADD. The flag signal FLAG may maintain the first bit value.

In some embodiments, the flag signal FLAG may have the first bit value, and the input row address ROW_ADD input after the first input row address may be smaller than or equal to the reference address Rpre and greater than the row address Rfind stored in second register 740. In this case, the register control circuit 710 may wait without storing the input row address ROW_ADD in the second register 740. The flag signal FLAG may maintain the first bit value.

In some embodiments, the flag signal FLAG may have the second bit value, and the input row address ROW_ADD input after the first input row address may be greater than the reference address Rpre and smaller than the row address Rfind stored in second register 740. In this case, the register control circuit 710 may provide the input row address ROW_ADD to the second register 740 so that the second register 740 stores the input row address ROW_ADD. The flag signal FLAG may maintain the second bit value.

In some embodiments, the register control circuit 710 may control the second register 740 so that second register 740 provides the row address Rfind to the first register 720 in response to the monitoring signal CMD1. The register control circuit 710 may control the second register 740 so that the second register 740 outputs the row address Rfind as the candidate address CADD in response to the monitoring signal CMD1. The second register 740 may output the candidate address CADD to the row address checker. In this case, the flag signal FLAG may have an initial value. The initial value may be, for example, the first bit value. However, it is not limited thereto.

The first register 720 may store the reference address Rpre. The reference address Rpre may be a row address that has been detected as the candidate address CADD in the previous monitoring period of the monitoring period. The first register 720 may provide the reference address Rpre to the first comparator 730. In some embodiments, the first register 720 may store the row address Rfind output from the second register 740 as the reference address Rpre. In this specification, the row address stored in the first register 720 may be referred to as the reference address Rpre.

The first register 720 may receive the reference address change signal from the row address checker. The first register 720 may change the reference address Rpre based on the reference address change signal.

The first comparator 730 may compare the input row address ROW_ADD provided from the memory controller (e.g., 120 in FIG. 1) with the reference address Rpre, and output the first comparison result signal CR1. The first comparison result signal CR1 may represent the comparison result between the input row address ROW_ADD and the reference address Rpre. For example, when the input row address ROW_ADD is smaller than or equal to the reference address Rpre, the first comparison result signal CR1 may have the first value. As another example, when the input row address ROW_ADD is greater than the reference address Rpre, the first comparison result signal CR1 may have the second value different from the first value. In an embodiment, the first value and the second value may be expressed as bit values, but are not limited thereto. The first comparison result signal CR1 may be provided to the register control circuit 710 and the flag generation circuit 760. The first comparator 730 may be implemented as a digital comparator, but is not limited thereto.

The second register 740 may store the input row address ROW_ADD under control of the register control circuit 710. The second register 740 may provide the stored row address Rfind to the second comparator 750. The second register 740 may output the stored row address Rfind under the control of the register control circuit 710. The output row address Rfind may be provided to the first register 720, and/or the output row address Rfind may be provided to the row address checker as the candidate address CADD.

In some embodiments, during the monitoring period, the input row address ROW_ADD may be stored in the second register 740 as a candidate for the candidate address CADD. That is, the input row address ROW_ADD may be a candidate for the candidate address CADD, and the candidate address CADD may be a candidate for the aggressor row address (e.g., AGRA in FIG. 4). The row address Rfind stored in the second register 740 in response to the monitoring signal CMD1 may be output as the candidate address CADD. For example, when the aggressor row refresh operation is performed, the row address Rfind may be output as the candidate address CADD.

In some embodiments, the input row address ROW_ADD detected as the candidate address CADD may be greater than the reference address Rpre. In addition, the number of input row addresses ROW_ADD that are detected as the candidate addresses CADD in a specific monitoring period may be one. Accordingly, the candidate addresses CADD greater than the reference address Rpre may be detected one by one during each monitoring period. In some embodiments, the input row address ROW_ADD, which is detected as the candidate address CADD greater than the reference address Rpre, may be sequentially stored in the second register 740. Here, the sequentially stored order is, for example, ascending order, and in this case, the ascending order may mean that the number of the row address gradually increases. However, it is not limited thereto.

The second comparator 750 may compare the input row address ROW_ADD with the row address Rfind stored in the second register 740, and output the second comparison result signal CR2. The second comparison result signal CR2 may represent the comparison result between the input row address ROW_ADD and the row address Rfind.

For example, when the input row address ROW_ADD is smaller than the row address Rfind, the second comparison result signal CR2 may have a third value. As another example, when the input row address ROW_ADD is greater than or equal to the row address Rfind, the second comparison result signal CR2 may have a fourth value different from the third value. In an embodiment, the third value and the fourth value may be expressed as bit values, but are not limited thereto. The second comparison result signal CR2 may be provided to the register control circuit 710 and the flag generation circuit 760. The second comparator 750 may be implemented as a digital comparator, but is not limited thereto.

The flag generation circuit 760 may output the flag signal FLAG based on the monitoring signal CMD1, the first comparison result signal CR1, and the second comparison result signal CR2. In some embodiments, if the input row address ROW_ADD is smaller than or equal to the reference address Rpre, the flag generation circuit 760 may output the flag signal FLAG having the first bit value. In some embodiments, when the input row address ROW_ADD is greater than the reference address Rpre in the state where the flag signal FLAG has the first bit value, the flag generation circuit 760 may output the flag signal FLAG having the second bit value.

In some embodiments, the flag generation circuit 760 may initialize the flag signal FLAG in response to the monitoring signal CMD1. In this case, the flag signal FLAG may have an initial value, and the initial value may be, for example, the first bit value.

The flag signal FLAG may be a signal that indicates execution of either a first mode or a second mode by having the first bit value or the second bit value. In an embodiment, when the flag signal FLAG has the first bit value, the first row address generator 700 may execute the first mode. The first mode may be a mode that detects a first minimum input row address among the plurality of input row addresses ROW_ADD. In another embodiment, when the flag signal FLAG has the second bit value, the first row address generator 700 may execute the second mode. The second mode may be a mode that detects a second minimum input row address among the input row addresses ROW_ADD that are greater than the reference address Rpre.

The flag generation circuit 760 may include a mode control circuit 761 and a status register 762. The mode control circuit 761 may control the status register 762 based on the first comparison result signal CR1, the second comparison result signal CR2, and the monitoring signal CMD1.

In some embodiments, the mode control circuit 761 may control the status register 762 to output the flag signal FLAG having the initial value in response to the monitoring signal CMD1. The initial value may be, for example, the first bit value.

In some embodiments, when the first comparison result signal CR1 has the first value in the state in which the flag signal FLAG has the initial value, the mode control circuit 761 may control the status register 762 to output the flag signal FLAG having the first bit value.

In some embodiments, when the first comparison result signal CR1 has the second value in the state in which the flag signal FLAG has the initial value, the mode control circuit 761 may control the status register 762 to output the flag signal FLAG having the second bit value.

In some embodiments, when the first comparison result signal CR1 has the first value and the second comparison result signal CR2 has the third value in the state in which the flag signal FLAG has the first bit value, the mode control circuit 761 may control the status register 762 to output the flag signal FLAG having the first bit value.

As described above, the first row address generator 700 has the advantage of efficiently controlling the row hammer by including a register for storing addresses that have been detected as the candidate address CADD and a register for storing addresses to be detected as the candidate address CADD.

In addition, according to the above description, the number of registers included in the first row address generator 700 is reduced, which has the effect of improving the integration of the memory device.

Figure 19:
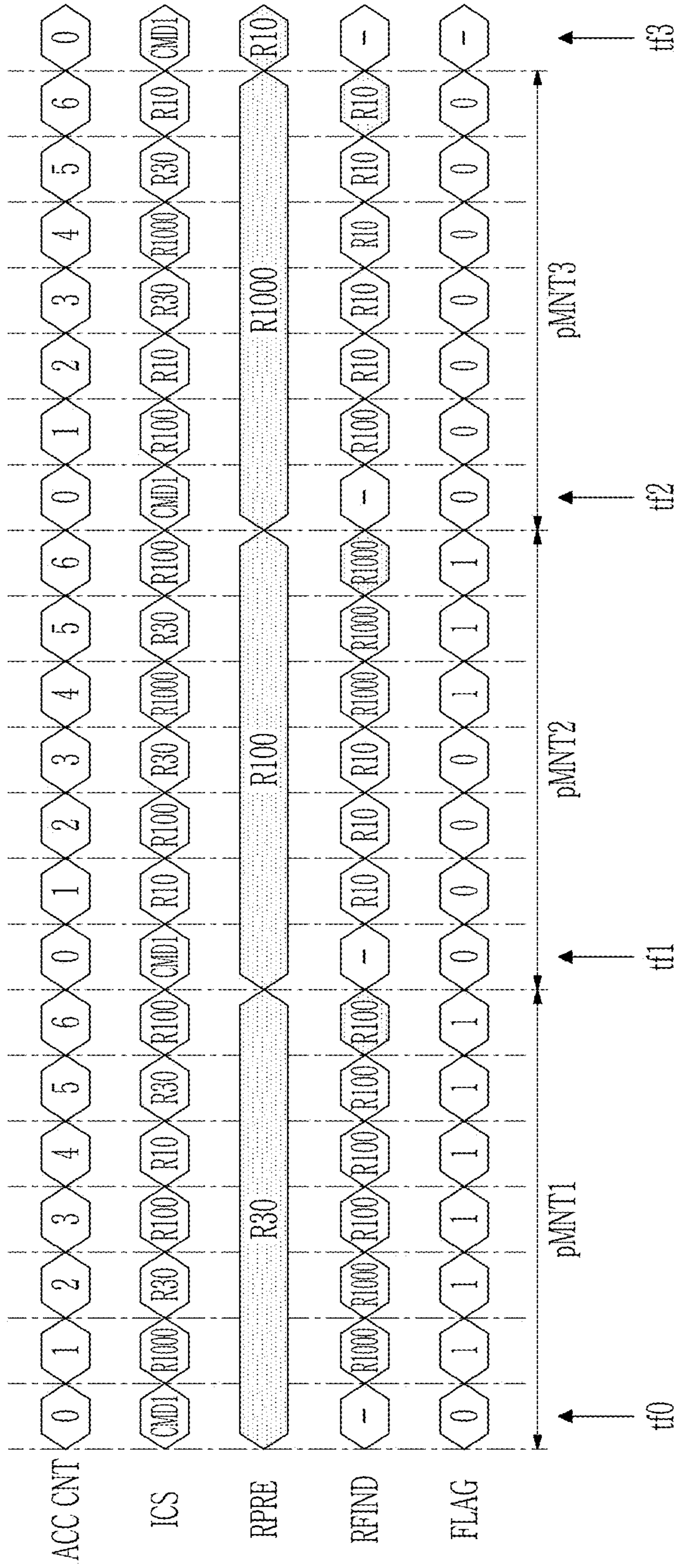
FIG. 19 is a diagram for describing a timing of an operation for managing a row hammer according to an embodiment.

FIG. 19 is a diagram for describing a timing of an operation for managing a row hammer according to an embodiment.

Referring to FIGS. 18 and 19, the first row address generator 700 according to an embodiment may receive an internal command signal ICS. The internal command signal ICS may include the monitoring signal CMD1 and the row addresses. The monitoring signal CMD1 may be transmitted in cycles of the first monitoring length. The row addresses may include an aggressor pattern.

For example, it is assumed that the row hammer aggressor pattern is a pattern in which a row hammer attack is performed on memory cell rows having a row address 10 R10, a row address 30 R30, a row address 100 R100, and a row address 1000 R1000, respectively, more than once. The cycle of the aggressor row refresh operation may correspond to the type of row address that is subject to a row hammer attack. For example, in the row hammer aggressor pattern illustrated in FIG. 19, there are four types of row addresses subject to the row hammer attack, so the refresh operation cycle illustrated in FIG. 19 may be four. The monitoring signal CMD1 may be input at each cycle (e.g., times tf0, tf1, tf2, and tf3) of the refresh operation.

In an embodiment, the monitoring signal CMD2 of FIG. 17 may be input at the times tf0 and tf2, and the monitoring signal CMD3 may be input at the times tf1 and tf3. For example, the monitoring signals CMD2 and CMD3 have the second monitoring length and may be alternately input at different refresh times.

The total number of accesses within a cycle of the refresh operation may correspond to the product of the cycle and the type of row address subject to the row hammer attack. For example, within the cycle corresponding to the time interval (e.g., between the time tf0 and the time tf1) between one monitoring signal CMD1 and another monitoring signal CMD1, the number of access counts ACC CNT is "6", so, the total number of accesses within the cycle of the refresh operation may be "24 (=6*4)". However, it is not limited thereto.

Referring to FIG. 19, the monitoring period may be, for example, a period from after the monitoring signal CMD1 is input to before the next monitoring signal CMD1 is input. FIG. 19 illustrates a first monitoring period pMNT1, a second monitoring period pMNT2, and a third monitoring period pMNT3, and each of the monitoring periods pMNT1 to pMNT3 corresponds to the first monitoring length in FIG. 18.

It is assumed that the initial value of the reference address Rpre is the row address 30 R30.

The access count ACC CNT may increase by +1 each time each of the row addresses R10, R30, R100, and R1000 is input to the first row address generator 700. The access count ACC CNT may be initialized to the initial value in response to the monitoring signal CMD1. Referring to FIG. 18, for example, when the monitoring signal CMD1 is input to the first row address generator 700, the access count ACC CNT may be initialized to "0".

When the monitoring signal CMD1 is input, the flag signal FLAG may be the first bit value (e.g., "0").

Referring to the first monitoring period pMNT1 illustrated in FIG. 19, in the first monitoring period pMNT1, the row address 1000 R1000, the row address 30 R30, the row address 100 R100, the row address 10 R10, the row address 30 R30, and the row address 100 R100 may be input sequentially. In some embodiments, the first row address generator 700 may temporarily store the first input row address first input in the monitoring period as the candidate for the candidate address CADD. Referring to FIG. 19, for example, in the first monitoring period pMNT1, the first input row address is the row address 1000 R1000. The register control circuit 710 stores the row address 1000 R1000 in the second register 740. The row address 1000 R1000 is stored in the second register 740 as the candidate (for example, row address Rfind illustrated in FIG. 19) of the candidate address CADD.

In some embodiments, the first row address generator 700 may execute one of the first mode and the second mode based on the first input row address and the reference address Rpre. Referring FIG. 19, for example, the row address 1000 R1000 is greater than the row address 30 R30, so the bit value of the flag signal FLAG is the second bit value (for example, "1"). As the flag signal FLAG has the second bit value, the second mode may be executed.

In some embodiments, when the input row address input after the first input row address in the second mode is greater than the reference address Rpre and the input row address is smaller than the temporarily stored row address (as the candidate for the candidate address CADD), the first row address generator 700 may temporarily store the input row address as the candidate for the candidate address CADD.

In an embodiment, in second mode, when the input row address is greater than the reference address Rpre and smaller than the row address Rfind already stored in the second register 740, the input row address may be stored in the second register 740.

Referring to FIG. 19, for example, the row address 30 R30 input after the row address 1000 R1000 is the same as the reference address Rpre. Therefore, the row address 30 R30 is not stored in the second register 740. The row address 100 R100 input after the row address 30 R30 is greater than the row address 30 R30 which is the reference address Rpre. The row address 100 R100 is smaller than the row address 1000 R1000 which is the row address Rfind already stored in the second register 740. Therefore, the row address 100 R100 is stored in the second register 740. In this way, the row address 10 R10, the row address 30 R30, and the row address 100 R100 are sequentially input, and according to the size conditions in the second mode described above, the row address Rfind stored in the second register 740 is the row address 100 R100.

In some embodiments, in the second mode, the first row address generator 700 may output the row address temporarily stored in the monitoring period as the candidate address CADD in response to the monitoring signal CMD1.

As illustrated in the row address Rfind in the first monitoring period pMNT1 illustrated in FIG. 19, the row address 100 R100 is detected as the candidate address CADD after the row address 30 R30 in the first monitoring period pMNT1. The row address 100 R100 may be output in response to the monitoring signal CMD1.

In some embodiments, the first row address generator 700 may detect the first input row address greater than the reference address Rpre as the candidate address CADD among the plurality of input row addresses in the first monitoring period pMNT1, and store the detected first input row address in the second resistor 740. In an embodiment, the first input row address (or first row address) may be the smallest row address among the input row addresses (or row addresses) input during the first monitoring section.

Referring to FIG. 19, for example, among the row address 10 R10, the row address 30 R30, the row address 100 R100, and the row address 1000 R1000 input during the first monitoring section, the row addresses greater than the row address 30 R30 that are the reference addresses Rpre are the row address 100 R100 and the row address 1000 R1000. The smallest row address among the row address 100 R100 and the row address 1000 R1000 is the row address 100 R100, so the first input row address (or first row address) is the row address 100 R100.

In some embodiments, during the refresh operation (i.e., at the time tf1) after the first monitoring period pMNT1, the first row address generator 700 may store the first input row address (or first row address) in the first register 720 as the reference address Rpre. Referring to FIG. 19, for example, when the monitoring signal CMD1 is input after the first monitoring period pMNT1, the row address 100 R100, which is the row address Rfind detected in the first monitoring period pMNT1, is stored in the first register 720 as the reference address Rpre.

Referring to the second monitoring period pMNT2 after the first monitoring period pMNT1 illustrated in FIG. 19, in the second monitoring period pMNT2, the row address 10 R10, the row address 100 R100, the row address 30 R30, the row address 1000 R1000, the row address 30 R30, and the row address 100 R100 may be input sequentially.

In some embodiments, the first row address generator 700 may store the first input row address (or first row address) as the reference address Rpre in the second monitoring period pMNT2. Referring to FIG. 19, for example, the first input row address (or first row address) is the row address 100 R100, so the row address 100 R100 is stored in the first register 720 as the reference address Rpre in the second monitoring period pMNT2. When the monitoring signal CMD1 is input, the flag signal FLAG may be the first bit value (e.g., "0"). The row address 10 R10, which is the first input row address, is stored in the second register 740 (e.g., row address Rfind).

In some embodiments, the first row address generator 700 may execute the first mode when the first input row address is smaller than or equal to the reference address Rpre. Referring to FIG. 19, for example, since the row address 10 R10 is smaller than the row address 100 R100, the flag signal FLAG maintains the first bit value, so the first mode is executed. Then, since the row address 100 R100 and the row address 30 R30 are each greater than the row address 10 R10 stored as the candidate for the candidate address CADD (e.g., row address Rfind) in the first mode, the bit value of the flag signal FLAG is still the first bit value.

In some embodiments, in the first mode, when the input row address input after the first input row address is greater than the reference address Rpre, the first row address generator 700 may temporarily store the input row address as the candidate for the candidate address CADD, and execute the second mode. Referring to FIG. 19, for example, the row address 1000 R1000 input after the row address 30 R30 is greater than the row address 100 R100, so the row address 1000 R1000 is stored in the second register 740. The bit value of the flag signal FLAG changes from the first bit value to the second bit value (for example, “1”). In the second mode, the row address 30 R30 input after the row address 1000 R1000 is smaller than the reference address Rpre, and the row address 100 R 100 input after the row address 30 R30 is the same as the reference address Rpre, so the row address Rfind stored in the second register 740 is maintained as the row address 1000 R1000.

In some embodiments, the first row address generator 700 may detect the second input row address (or second row address) greater than the first input row address (or first row address) as the candidate address CADD in the second monitoring period pMNT2, and store the second input row address (or second row address) in the second register 740. In an embodiment, the second input row address (or second row address) may be a row address next smaller than the first input row address (or first row address) among the row addresses input during the second monitoring section.

Referring to FIG. 19, for example, the first input row address (or first row address) is the row address 100 R100. Among the row address 10 R10, the row address 30 R30, the row address 100 R100, and the row address 1000 R1000 input during the second monitoring section, the row address greater than the row address 100 R100 is the row address 1000. R1000. Therefore, the second input row address (or second row address) is the row address 1000 R1000.

In some embodiments, during the refresh operation after the second monitoring period pMNT2, the first row address generator 700 may store the second input row address (or second row address) in the first register 720 as the reference address Rpre. Referring to FIG. 19, the row address 1000 R1000 is stored in the first register 720 as the reference address Rpre. When the monitoring signal CMD1 is input, the flag signal FLAG may be the first bit value (e.g., “0”).

In some embodiments, in the third monitoring period pMNT3 after the second monitoring period pMNT2 illustrated in FIG. 19, the row address 100 R100, which is the first input row address, is stored in the second register 740 (e.g., row address Rfind).

In some embodiments, in the first mode, when the input row address input after the first input row address is smaller than or equal to the reference address Rpre and the input row address is smaller than or equal to the row address temporarily stored as the candidate for the candidate address CADD, the first row address generator 700 may temporarily store the input row address as the candidate in the candidate address CADD.

For example, referring to FIG. 19, the row address 10 R10 input after the row address 100 R100 is smaller than the row address 1000 R1000, and is smaller than the row address 100 R100, so the row address 10 R10 is stored in the second register 740. In this case, the flag signal FLAG is maintained as the first bit value. In the first mode, the row addresses R30, R1000, R30, and R10 input after the row address 10 R10 are smaller than the row address 1000 R1000 which is the reference address Rpre. The row addresses R30, R1000, R30, and R10 are greater than or equal to the row address 10 R10 which is the row address Rfind stored in the second register 740. Therefore, the row address 10 R10 continues to be stored in the second register 740.

In some embodiments, when the plurality of input row addresses are smaller than or equal to the reference address Rpre, the first row address generator 700 may detect the minimum input row address among the plurality of input row addresses as the candidate address CADD. For example, referring to FIG. 19, in the third monitoring period pMNT3, the plurality of input row addresses are the row address 100 R100, the row address 10 R10, the row address 30 R30, the row address 1000 R1000, the row address 30 R30, and the row address 10 R10. In the third monitoring period pMNT3, the reference address Rpre is the row address 1000 R1000, so the minimum input row address among the plurality of input row addresses is the row address 10 R10 and the row address 10 R10 is detected as the candidate address CADD. In response to the monitoring signal CMD1 input after the third monitoring period pMNT3, the row address 10 R10 is output as the candidate address CADD. Since no row address greater than the row address 1000 R1000, which is the reference address Rpre, has been detected, the flag signal FLAG maintains the first bit value, and the first row address generator 700 may complete one cycle of monitoring. The first row address generator 700 may start monitoring starting from row address 10 R10.

According to the above-described embodiment, there is an effect of improving the integration of the memory device by controlling various types of row hammers.

In addition, according to the above-described embodiment, it is possible to improve the performance and reliability of the memory device by controlling various types of row hammers.

Figure 20:
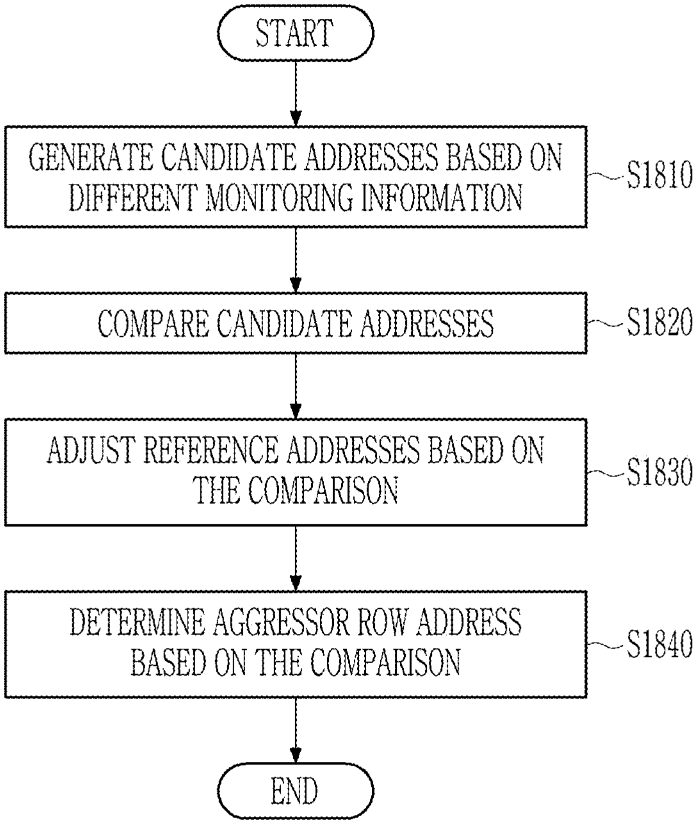
FIG. 20 is a flowchart of a method for generating an aggressor row address according to an embodiment.

FIG. 20 is a flowchart of a method for generating an aggressor row address according to an embodiment.

Referring to FIG. 20, a memory device according to an embodiment may generate an aggressor row address.

The memory device may generate candidate addresses based on the reference address and different monitoring information (S1810). The monitoring information may include a monitoring start time and a monitoring length. The monitoring start time corresponds to an aggressor row refresh time, and the basic unit of the monitoring length may be an aggressor row refresh interval. For example, the first monitoring length may correspond to the aggressor row refresh interval, and the second monitoring length may correspond to the ‘aggressor row refresh interval*2’. The monitoring length may correspond to the monitoring level. For example, the first monitoring length may correspond to the first level (higher level), and the second monitoring length may correspond to the second level (lower level).

For example, the memory device may monitor the input row address based on different monitoring start times and/or different monitoring lengths. For example, the memory device may perform monitoring based on the first monitoring length at a first refresh time, monitoring based on the second monitoring length at the first refresh time, and monitoring based on the second monitoring length at a second refresh time following the first refresh time.

The memory device may perform monitoring by comparing the reference address and input row addresses. As a result of the monitoring, the memory device may output one of the input row addresses as the candidate address. In an embodiment, the memory device may output the smallest address among the input row addresses that is greater than the reference address (or the immediately preceding aggressor row address) as the candidate address. In an embodiment, when there is no input row address greater than the reference address, the memory device may output the smallest address among the input row addresses as the candidate address.

The memory device may compare the candidate addresses (S1820). In this case, the memory device may compare the candidate addresses at different times. For example, the memory device may compare a higher-level candidate address at a previous time and a lower-level candidate address at a current time. That is, the memory device may store the candidate addresses. When the candidate addresses match, the memory device may determine it as the normal monitoring. When the candidate addresses do not match, the memory device may determine it as the abnormal monitoring.

The memory device may modify the reference address based on the comparison result (S1830). In addition, the memory device may determine the aggressor row address based on the comparison result (S1840).

In an embodiment, the memory device may modify the lower-level reference address when the candidate addresses match (i.e., normal monitoring). The memory device may use the higher-level candidate address as the lower-level reference address. The memory device may output the higher-level candidate address as the aggressor row address. The memory device may generate the lower-level candidate address based on a new reference address.

In an embodiment, the memory device may modify the higher-level reference address when the candidate addresses do not match (i.e., abnormal monitoring).

The memory device may use the lower-level candidate address as the higher-level reference address. The memory device may output the lower-level candidate address as the aggressor row address. The memory device may generate the higher-level candidate address based on the new reference address.

The memory device may refresh memory cells of rows corresponding to row addresses adjacent to the row corresponding to the aggressor row address.

Figure 21:
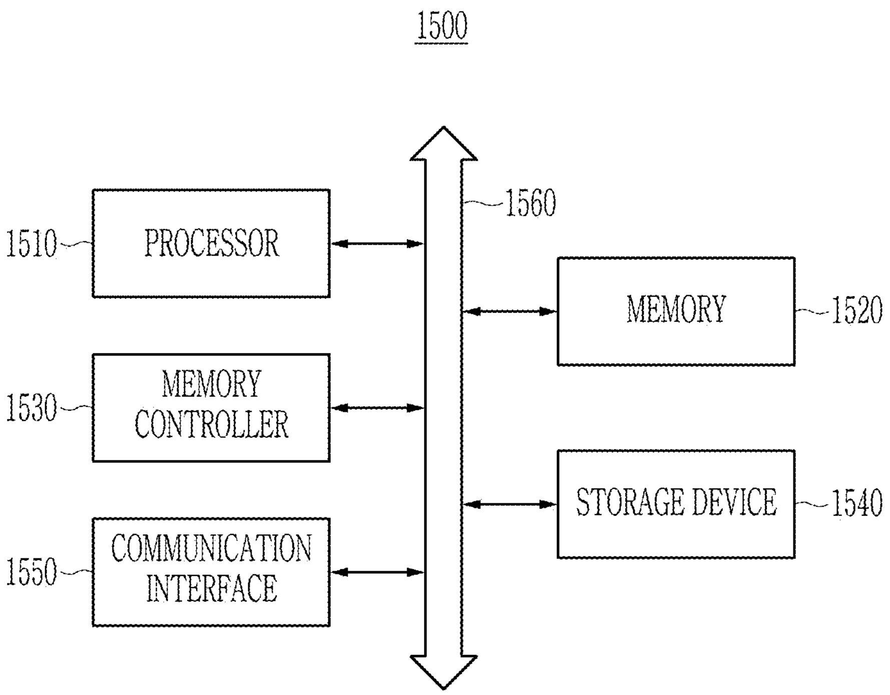
FIG. 21 is a block diagram of a computing system according to an embodiment.

FIG. 21 is a block diagram of a computing system according to an embodiment.

Referring to FIG. 21, a computing system 1500 according to an embodiment includes a processor 1510, a memory 1520, a memory controller 1530, a storage device 1540, a communication interface 1550, and a bus 1560. The computing system 1500 may further include other general-purpose components.

The processor 1510 controls the overall operation of each component of the computing system 1500. The processor 1510 may be implemented as at least one of various processing units, such as a central processing unit (CPU), an application processor (AP), and a graphic processing unit (GPU).

The memory 1520 stores various data and commands. The memory controller 1530 controls the transmission of the data or commands to and from memory 1520. The memory 1520 and/or the memory controller 1530 may perform the refresh operation described with reference to FIGS. 1 to 20. For example, the memory 1520 may perform an aggressor row refresh operation in response to a command from the memory controller 1530. The memory 1520 may further perform the normal refresh or TRR. For example, the memory 1520 may generate the candidate addresses based on different monitoring start times and/or different monitoring lengths. The memory 1520 may determine whether the candidate addresses match and determine the aggressor row address based on the determination result. The memory 1520 may refresh memory cells of rows adjacent to the row corresponding to the aggressor row address. The memory 1520 may protect against the aggressor patterns of various lengths by performing the refresh based on different monitoring start times and/or different monitoring lengths.

In some embodiments, the memory controller 1530 may be provided as a separate chip from the processor 1510. In some embodiments, the memory controller 1530 may be provided as an internal component of the processor 1510.

The storage device 1540 non-temporarily stores programs and data. In some embodiments, the storage device 1540 may be implemented as non-volatile memory. The communication interface 1550 supports wired and wireless Internet communication of the computing system 1500. In addition, the communication interface 1550 may support various communication methods other than Internet communication. The bus 1560 provides communication functions between components of the computing system 1500. The bus 1560 may include at least one type of bus depending on the communication protocol between components.

Figure 22:
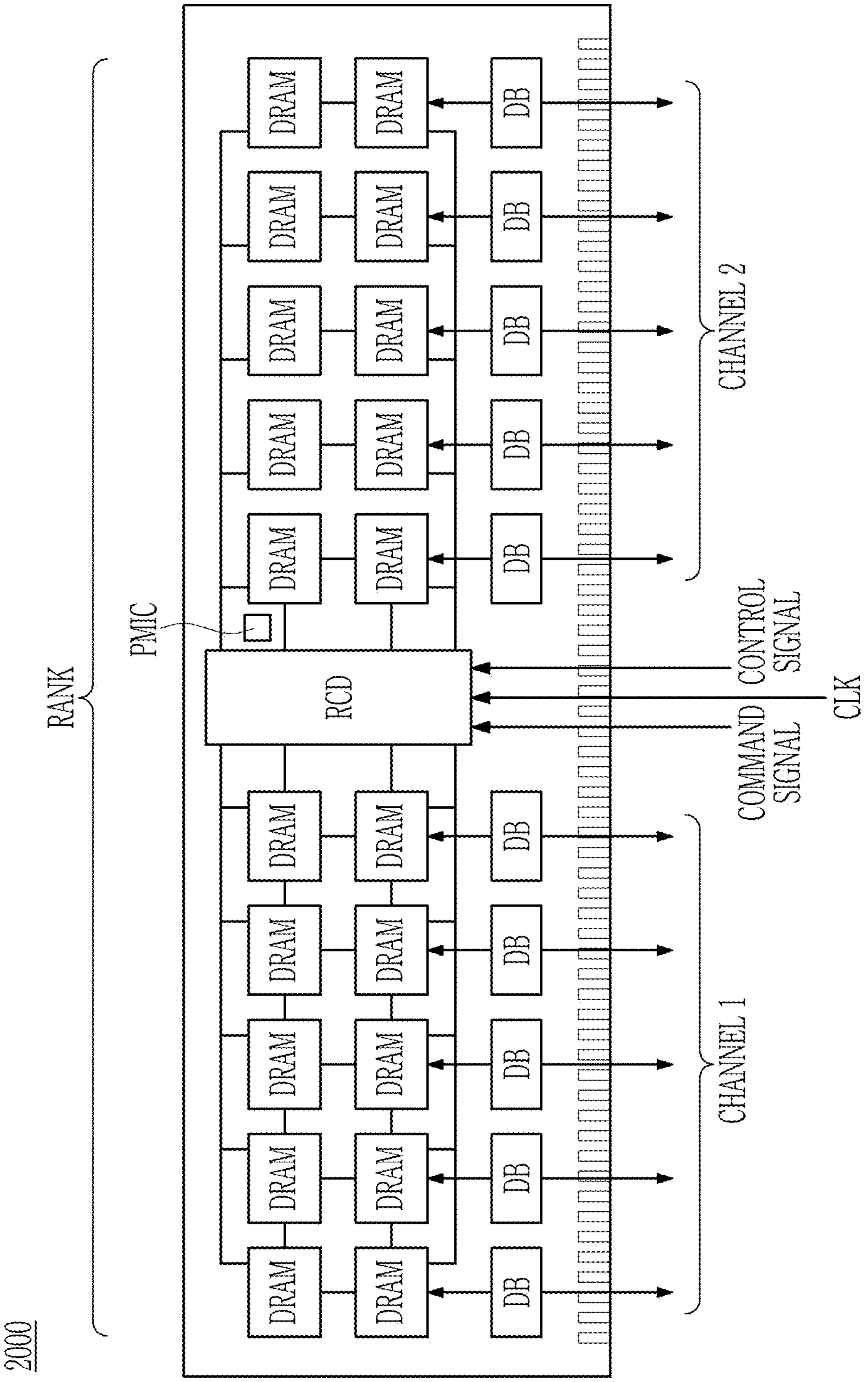
FIG. 22 is a diagram illustrating a memory module according to an embodiment.

FIG. 22 is a diagram illustrating a memory module according to an embodiment.

Referring to FIG. 22, a memory module 2000 according to an embodiment may include a plurality of memory chips (e.g., DRAM), each including a memory cell array, a buffer chip (RCD) for routing transmission and reception signals to and from the memory controller or managing memory operations for the memory chips, and a power management chip (PMIC). The RCD may control the memory chips (DRAM) and the power management chip (PMIC) under the control of the memory controller. For example, the RCD may receive a command signal, a control signal, and a clock signal CLK from the memory controller.

The memory chips (DRAM) may each be connected to a corresponding data buffer among the data buffers (DBs) through a corresponding data transmission line and may transmit and receive a data signal and a data strobe signal. The memory chips (DRAM) may each be connected to the data buffers (DBs) through the corresponding data transmission line and transmit and receive parity data and the data strobe signal.

The memory module 2000 may include a programmable read-only memory (EEPROM). The EEPROM may include initial information or device information of the memory module 2000. By way of example, the EEPROM may include initial information or device information such as a module form, a module configuration, storage capacity, a module type, and an execution environment of the memory module 2000. When the memory system including the memory module 2000 is booted, the memory controller may read the device information from the EEPROM and recognize the memory module based on the read device information.

The memory module 2000 may include a plurality of ranks. In an embodiment, each rank may include eight bank groups. Each bank group may include four banks.

The memory module 2000 may perform the refresh operation described with reference to FIGS. 1 to 20. For example, the memory module 2000 may perform the aggressor row refresh operation. For example, the memory module 2000 may generate the candidate addresses based on different monitoring start times and/or different monitoring lengths. The memory module 2000 may determine whether the candidate addresses match and determine the aggressor row address based on the determination result. The memory module 2000 may refresh memory cells of the rows adjacent to the row corresponding to the aggressor row address. The memory module 2000 may protect against the aggressor patterns of various lengths by performing the refresh based on different monitoring start times and/or different monitoring lengths.

Figure 23:
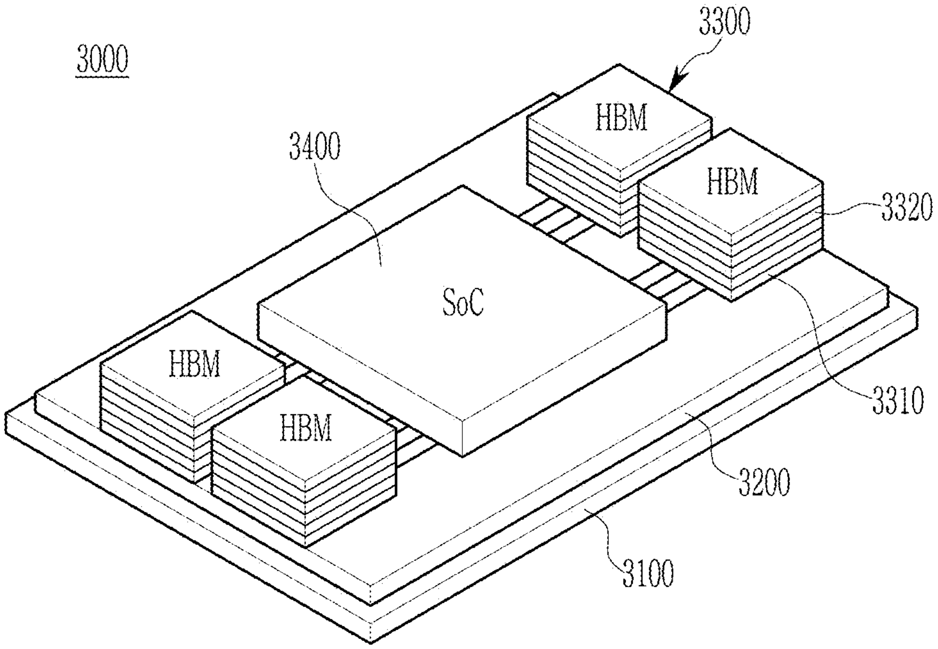
FIG. 23 is a diagram illustrating a semiconductor package according to an embodiment.

FIG. 23 is a diagram illustrating a semiconductor package according to an embodiment.

Referring to FIG. 23, a semiconductor package 3000 according to an embodiment may be a memory module that includes at least one stack semiconductor chip 3300 mounted on a package substrate 3100, such as a printed circuit board, and a system on chip (SoC) 3400. In some embodiments, an interposer 3200 may be optionally further provided on the package substrate 3100. The stack semiconductor chip 3300 may be formed as a chip on chip (CoC).

The stack semiconductor chip 3300 may include at least one memory chip 3320 stacked on a buffer chip 3310 such as a logic chip. The buffer chip 3310 and at least one memory chip 3320 may be connected to each other through a through silicon via (TSV). The buffer chip 3310 may perform a training operation on the memory chip 3320. For example, the stack semiconductor chip 3300 may be a high bandwidth memory (HBM) of 500 GB/sec to 1 TB/sec or more.

At least one memory chip 3320 may perform the refresh operation described with reference to FIGS. 1 to 20. For example, at least one memory chip 3320 may perform the aggressor row refresh operation. For example, at least one memory chip 3320 may generate the candidate addresses based on different monitoring start times and/or different monitoring lengths. At least one memory chip 3320 may determine whether the candidate addresses match and determine the aggressor row address based on the determination result. At least one memory chip 3320 may refresh memory cells of the rows adjacent to the row corresponding to the aggressor row address. At least one memory chip 3320 may protect against the aggressor patterns of various lengths by performing the refresh based on different monitoring start times and/or different monitoring lengths.

In some embodiments, each component or a combination of two or more components described with reference to FIGS. 1 to 23 may be implemented as a digital circuit, a programmable or non-programmable logic device or array, or an application specific integrated circuit (ASIC), etc. Although embodiments of the present disclosure have been described in detail hereinabove, the scope of the present disclosure is not limited thereto, but may include several modifications and alterations made by those skilled in the art using a basic concept of the present invention as defined in the appended claims.

What is claimed is:

1. A memory device, comprising:

a memory cell array including a plurality of memory cells; and a refresh control circuit configured to generate a refresh row address and perform a refresh operation on memory cells of a row corresponding to the refresh row address, wherein the refresh control circuit includes a row hammer managing circuit (RHMC) including:

a first row address generator configured to receive first input row addresses during a first monitoring length and determine a first candidate address among the first input row addresses based on a first reference address;

a second row address generator configured to receive second input row addresses during a second monitoring length longer than the first monitoring length, and determine a second candidate address among the second input row addresses based on a second reference address; and a row address checker configured to directly compare the first candidate address and with the second candidate address, and determine an aggressor row address based on a result of the comparison of the first and second candidate addresses, wherein the row corresponding to the refresh row address is adjacent to a row corresponding to the aggressor row address, and wherein each of the first monitoring length and the second monitoring length is a cycle for performing the refresh operation.

2. The memory device of claim 1, wherein:

the first row address generator is configured to transmit the first candidate address to the row address checker based on the first monitoring length as the cycle, the second row address generator is configured to transmit the second candidate address to the row address checker based on the second monitoring length as the cycle, and the row address checker is configured to store at least one of the first candidate address and the second candidate address.

3. The memory device of claim 2, wherein:

the row address checker is configured to compare the first candidate address at a first aggressor row refresh time with the second candidate address at a second aggressor row refresh time following the first aggressor row refresh time.

4. The memory device of claim 3, wherein:

the row hammer managing circuit is configured such that the row address checker determines the first candidate address at the second aggressor row refresh time as the aggressor row address when the first candidate address at the first aggressor row refresh time matches the second candidate address at the second aggressor row refresh time.

5. The memory device of claim 3, wherein:

the row hammer managing circuit is configured such that the row address checker changes the second reference address to the first candidate address at the second aggressor row refresh time when the first candidate address at the first aggressor row refresh time matches the second candidate address at the second aggressor row refresh time.

6. The memory device of claim 3, wherein:

the row hammer managing circuit is configured such that the row address checker determines the second candidate address at the second aggressor row refresh time as the aggressor row address when the first candidate address at the first aggressor row refresh time does not match the second candidate address at the second aggressor row refresh time.

7. The memory device of claim 3, wherein:

the row hammer managing circuit is configured such that the row address checker changes the first reference address to the second candidate address at the second aggressor row refresh time when the first candidate address at the first aggressor row refresh time does not match the second candidate address at the second aggressor row refresh time.

8. The memory device of claim 3, wherein:

the second row address generator is configured to monitor the second input row addresses during the second monitoring length from the first aggressor row refresh time, the row hammer managing circuit further includes a third row address generator configured to determine a third candidate address by monitoring third input row addresses during the second monitoring length from the second aggressor row refresh time following the first aggressor row refresh time, and the row address checker is configured to determine the aggressor row address based on the first candidate address and one of the second candidate address and the third candidate address.

9. The memory device of claim 8, wherein:

the row hammer managing circuit is configured such that the row address checker deactivates the third candidate address when the first candidate address at the first aggressor row refresh time does not match the second candidate address at the second aggressor row refresh time.

10. The memory device of claim 9, wherein:

the third row address generator is configured to receive a mode control signal from the row address checker and transmit the third candidate address and a mode confirmation signal to the row address checker at a third aggressor row refresh time following the second aggressor row refresh time, and the row address checker is configured to transmit the mode control signal to the third row address generator and deactivate the third candidate address based on the mode confirmation signal.

11. The memory device of claim 1, further comprising:

a third row address generator configured to receive third input row addresses during a third monitoring length longer than the second monitoring length, and determine a third candidate address among the third input row addresses based on a third reference address, wherein the row address checker is configured to determine the aggressor row address based on the first candidate address, the second candidate address, and the third candidate address.

12. The memory device of claim 11, wherein:

the row address checker is configured to compare the first candidate address at a first time and the second candidate address at a second time, and compare the second candidate address at a third time and the third candidate address at the second time.

13. The memory device of claim 12, wherein:

the first time is earlier than the second time, and the third time is earlier than the first time.

14. The memory device of claim 13, wherein:

the row hammer managing circuit is configured such that the row address checker changes the first reference address and the second reference address to the third candidate address at the second time and determines the third candidate address at the second time as the aggressor row address, when the second candidate address at the third time does not match the third candidate address at the second time.

15. The memory device of claim 13, wherein:

the row hammer managing circuit is configured such that the row address checker changes the second reference address and the third reference address to the first candidate address at the second time and determines the first candidate address at the second time as the aggressor row address, when the first candidate address at the first time matches the second candidate address at the second time and the second candidate address at the third time matches the third candidate address at the second time.

16. The memory device of claim 11, wherein:

the first monitoring length corresponds to an aggressor row refresh interval, and the third monitoring length corresponds to 'aggressor row refresh interval*4'.

17. The memory device of claim 1, wherein:

the first monitoring length corresponds to an aggressor row refresh interval.

18. The memory device of claim 1, wherein:

the second monitoring length corresponds to 'aggressor row refresh interval*2'.

19. A memory device, comprising:

a memory cell array including a plurality of memory cells; and a refresh control circuit configured to:

generate candidate addresses based on a reference address and row addresses input during different monitoring lengths, compare the candidate addresses, modify the reference address based on the comparison result, generate an aggressor row address based on the comparison result, and output refresh row addresses of rows adjacent to a row corresponding to the aggressor row address, wherein the memory device is configured to perform a refresh operation on memory cells of rows corresponding to the refresh row addresses, and wherein each of the different monitoring lengths is a cycle for performing the refresh operation.

20. A method of a refresh operation for a memory device, the method comprising:

receiving row addresses during different monitoring lengths;

generating candidate addresses based on a reference address and the received row addresses;

comparing the candidate addresses;

modifying the reference address based on the comparison result;

determining an aggressor row address based on the comparison result; and performing a refresh on memory cells of a row adjacent to a row corresponding to the aggressor row address, wherein each of the different monitoring lengths is a cycle for performing the refresh on the memory cells of the row adjacent to the row corresponding to the aggressor row address.

* * * * *